(12) United States Patent
Ma et al.

(10) Patent No.: US 8,383,429 B2
(45) Date of Patent: Feb. 26, 2013

(54) METHOD AND APPARATUS FOR THERMAL TREATMENT OF SEMICONDUCTOR WORKPIECES

(75) Inventors: Yue Ma, Shanghai (CN); Chuan He, Shanghai (CN); Zhenxu Pang, Shanghai (CN); David Wang, Shanghai (CN); Voha Nuch, Shanghai (CN)

(73) Assignee: ACM Research (Shanghai) Inc. (CN)

( * ) Notice: Subject to any disclaimer, the term of this patent is extended or adjusted under 35 U.S.C. 154(b) by 458 days.

(21) Appl. No.: 12/733,436

(22) PCT Filed: Aug. 29, 2007

(86) PCT No.: PCT/CN2007/070582
§ 371 (c)(1),
(2), (4) Date: Jun. 1, 2010

(87) PCT Pub. No.: WO2009/026765
PCT Pub. Date: Mar. 5, 2009

(65) Prior Publication Data
US 2010/0240226 A1 Sep. 23, 2010

(51) Int. Cl.
*H01L 21/00* (2006.01)
(52) U.S. Cl. ...... 438/12; 438/15; 432/143; 257/E21.425
(58) Field of Classification Search ............... 438/9–15; 432/8, 59, 72, 143, 152, 176
See application file for complete search history.

(56) References Cited

U.S. PATENT DOCUMENTS

| | | | | |
|---|---|---|---|---|
| 3,484,085 A * | 12/1969 | Montagino | ............... | 266/132 |
| 4,498,833 A * | 2/1985 | Hertel | .................. | 414/217 |
| 4,886,412 A * | 12/1989 | Wooding et al. | ......... | 414/416.05 |
| 5,280,983 A * | 1/1994 | Maydan et al. | ............ | 294/119.1 |
| 5,411,358 A * | 5/1995 | Garric et al. | .................. | 414/277 |
| 5,997,286 A * | 12/1999 | Hemsath et al. | ............... | 432/59 |
| 6,173,938 B1 * | 1/2001 | McAndrew | .................... | 251/31 |
| 2002/0086259 A1 | 7/2002 | Shirakawa et al. | | |
| 2002/0112368 A1 | 8/2002 | Aswad | | |
| 2003/0131495 A1 | 7/2003 | Morad et al. | | |
| 2006/0009047 A1 | 1/2006 | Wirth et al. | | |
| 2007/0172786 A1 | 7/2007 | Katsumata et al. | | |

FOREIGN PATENT DOCUMENTS
CN 1387468 A 12/2002
JP 2002-257474 A 9/2002

\* cited by examiner

*Primary Examiner* — Michael Lebentritt
(74) *Attorney, Agent, or Firm* — Howard C. Miskin; Gloria Tsui-Yip

(57) ABSTRACT

The present invention provides an apparatus and method for rapid and uniform thermal treatment of semiconductor workpieces in two closely arranged thermal treatment chambers with a retractable door between them. The retractable door moves in between two thermal treatment chambers during heating or cooling process, and additional heating and cooling sources are provided for double-side thermal treatment of the semiconductor workpiece.

50 Claims, 14 Drawing Sheets

METHOD AND APPARATUS FOR THERMAL TREATMENT OF SEMICONDUCTOR WORKPIECES

FIELD

The present invention relates to an apparatus and a method for thermal treatment of semiconductor workpieces. More specifically, the apparatus includes two connected thermal treatment chambers and a retractable door between them. The apparatus and method allow the semiconductor workpieces be thermally treated from double sides by multiple heat transfer mechanisms at two different temperature settings.

BACKGROUND

In the production of semiconductor workpieces, numerous materials layers are deposited on a substrate during device fabrication. The deposited layers may have different thermal expansion coefficients and contain contaminants, defects or undesired microstructures, which all have negative effects on the semiconductor workpiece quality. Commonly a thermal treatment process is required to reduce or eliminate these negative effects before the semiconductor workpieces are transferred to the next fabrication step. Other deposited layers may need a thermal treatment process to improve their physical and electrical properties. For example freshly deposited copper films in copper interconnect process need an anneal process to reduce their resistivity and stabilize grain structures before the subsequent chemical mechanical polishing step. Conventional thermal treatment is realized with a single conductive, convective or radiant heat source. The single side thermal treatment often leads to a large initial temperature gradient along the thickness of the semiconductor workpiece in the direction perpendicular to its surface. Such a temperature gradient, together with difference in thermal expansion coefficients among the layers, result in stress mismatch and deforms the semiconductor workpiece, commonly known as "bowing". Severe bowing can cause device failure and yield loss. In practice the semiconductor workpiece is usually preheated for a period of time before the thermal treatment at the desired temperature to reduce bowing. Therefore the time of thermal process is greatly increased and the process throughput is limited. Similarly lengthy cooling step can also limit the process throughput. An apparatus and a method for thermal treatment of semiconductor workpieces with smaller temperature gradient and higher efficiency are desired.

SUMMARY

The present invention provides an apparatus and a method for rapid and double-side thermal treatment of semiconductor workpieces in two closely arranged thermal treatment chambers, each containing a first thermal treatment source and a second thermal treatment source, the two thermal treatment chambers are separated by a retractable door.

In one embodiment, the apparatus comprises a heating chamber and a cooling chamber being vertically arranged with a retractable door between them. The retractable door has a heating layer and a cooling layer. During a thermal treatment process, the retractable door moves in to separate the heating and cooling chambers. For a heating process, the heating layer of the retractable door provides an additional heating source for heating the front side of semiconductor workpiece, in addition to a fixed heating source for heating the back side of the semiconductor workpiece. The semiconductor workpiece is transported into the cooling chamber by a vertical transportation mechanism for a cooling process after the heating process is completed. During a cooling process the retractable door moves in between, the heating and cooling chambers. The cooling layer of the retractable door also provides an additional cooling source for cooling the front side of the semiconductor workpiece, in addition to the fixed cooling source for cooling the back side of the semiconductor workpiece.

In one embodiment, the semiconductor workpiece is preheated from both front and back sides before a heating process and precooled from both front and back sides before a cooling process.

In one embodiment, the apparatus comprises a heating chamber and a cooling chamber being arranged horizontally adjacent to each other, with a retractable door between them. A second heating source for heating the front side of the semiconductor workpiece is provided in the heating chamber, in addition to a first heating source for heating the back side of the semiconductor workpiece. The retractable door moves in between the heating and cooling chambers during a heating process. The semiconductor workpiece is transported into the cooling chamber by a horizontal transportation mechanism for a cooling process after the heating process is completed. A second cooling source for cooling the front side of the semiconductor workpiece is provided in the cooling chamber, in addition to a first cooling source for cooling the back side of the semiconductor workpiece. The retractable door moves in between the heating and cooling chambers during the cooling process.

In one embodiment, the heating chamber and cooling chamber work simultaneously and a plurality of semiconductor workpieces can be proceeded continuously.

In one embodiment, the semiconductor workpiece is preheated from both front and back sides before a heating process starts and precooled from both front and back sides before a cooling process.

In one embodiment, the retractable door removes the heat from the heating chamber when the cooling process is performed in the cooling chamber.

In one embodiment, both conductive heat transfer mechanism and convective heat transfer mechanism are utilized for double-side thermal treatment of the semiconductor workpiece.

In one embodiment, a method for thermal treatment of semiconductor workpieces is provided. The process is suitable for a thermal treatment apparatus with vertically stacked heating and cooling chambers, and a retractable door is provided to separate the chambers. Moving the retractable door in between the heating chamber and cooling chamber and transporting a semiconductor workpiece into the heating chamber; starting heating processes; moving the retractable door out between the heating chamber and cooling chamber and transporting the semiconductor workpiece from the heating chamber into the cooling chamber when the heating process completes; moving the retractable door in between the heating chamber and cooling chamber and starting cooling processes; transporting the semiconductor workpiece out of the cooling chamber.

In one embodiment, a method for thermal treatment of semiconductor workpiece is provided. The process is suitable for a thermal treatment apparatus with horizontally arranged heating and cooling chambers, and a retractable door is provided to separate the chambers. Moving the retractable door out between the heating chamber and the cooling chamber and transporting a first semiconductor workpiece into the heating chamber and a second semiconductor workpiece into the cooling chamber; moving the retractable door in between the heating chamber and cooling chamber and starting heating and cooling processes; transporting the second semiconductor workpiece out of the cooling chamber after the cooling process completes; moving the retractable door out between the heating chamber and cooling chamber and transporting the first semiconductor workpiece from the heating chamber into the cooling chamber after the heating process completes; transporting a third semiconductor workpiece into the heating chamber; moving the retractable door in between the heating chamber and cooling chamber and starting heating and cooling processes; repeating the above steps.

In one embodiment, the semiconductor workpiece is preheated before the heating process starts and precooled before the cooling process starts.

In one embodiment, both conductive heat transfer mechanism and convective heat transfer mechanism are utilized for the double-side thermal treatment on the workpiece.

The adapted double-side thermal treatment mechanism increases the efficiency and uniformity of the thermal treatment and reduces thermal stress mismatch and semiconductor workpiece deformation.

BRIEF DESCRIPTION OF DRAWINGS

The above or other features, natures or advantages of the present invention will be more obvious to the skilled person in the art by the following descriptions of the embodiments accompanying with the drawings, the same sign reference indicates the identical features throughout the description, and wherein.

DETAILED DESCRIPTION OF THE EMBODIMENTS

First Embodiment of the Apparatus

According to one aspect of the present invention, providing an apparatus comprising a heating chamber and a cooling chamber vertically arranged, each containing a fixed heating or cooling source, which is a fixed heating or cooling member. the heating and cooling chambers are separated by a retractable door. The retractable door moves in between the heating and cooling chambers during a heating or cooling process. The retractable door provides an additional heating source for heating the semiconductor workpiece. The heating chamber realizes the double-side heating of the semiconductor workpiece with the fixed heating member for heating the backside of the semiconductor workpiece and with the additional heating source for heating the front side of the semiconductor workpiece. Similarly, during a cooling process, the retractable door also moves in between the heating and cooling chambers. The retractable door provides an additional cooling source for cooling the semiconductor workpiece. The cooling chamber realize the double-side heating of the semiconductor workpiece with the fixed cooling member for cooling the front side of the semiconductor workpiece and with the additional cooling source for cooling the backside of the semiconductor workpiece.

Figure 1:
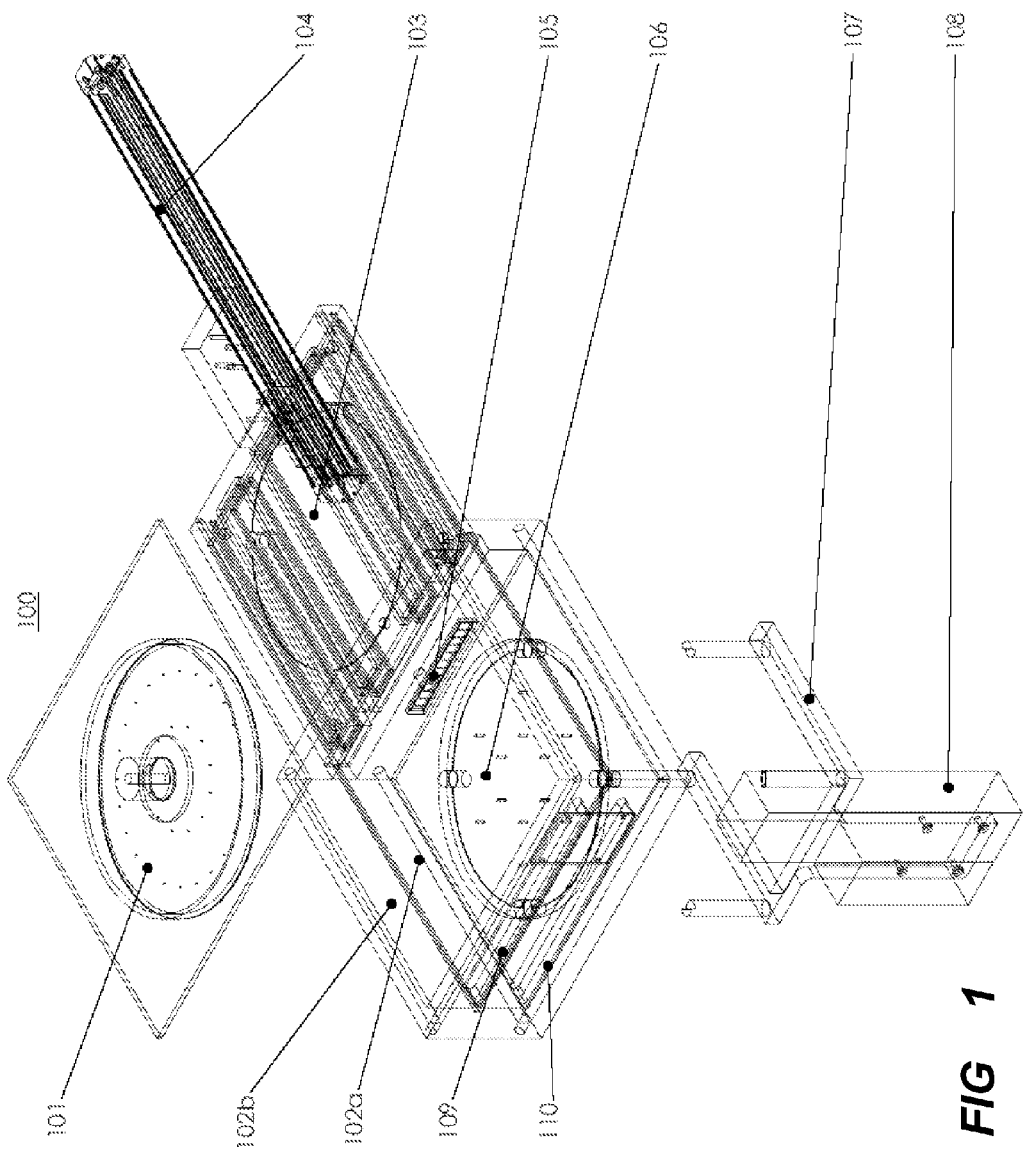
FIG. 1 illustrates a view of a disassembled thermal treatment apparatus with a heating chamber and a cooling chamber vertically arranged vertically with a retractable door therebetween.

As shown in FIG. 1, a view of a disassembled thermal treatment apparatus with a heating chamber and a cooling chamber vertically arranged and a retractable door therebetween, is illustrated. The thermal apparatus 100 comprises vertically arranged heating chamber 102a and cooling chamber 102b. In the embodiment shown in FIG. 1, the heating chamber 102a is positioned under the cooling chamber 102b. The heating chamber 102a and the cooling chamber 102b are separated by a retractable door 103. A fixed heating member 106 is set at the base of the heating chamber which is kept at a constant temperature. A window 110 is set on the sidewall of the heating chamber 102a for the semiconductor workpiece to be transferred into the heating chamber. A fluid distribution part 105 is also provided in the heating chamber 102a to provide required fluid during the heating process. A vertical transportation mechanism 107 is shown at the bottom of the heating chamber. The vertical transportation mechanism 107 comprises a plurality of pins, at least 3, to transport and position the semiconductor workpiece. The vertical transportation mechanism 107 is controlled by an actuator 108 for transporting and positioning the semiconductor workpiece. However, for the present invention, it is mainly concerned that the actuator 108 controls the vertical transportation mechanism 107 to lift the semiconductor workpiece from the heating chamber 102a into the cooling chamber 102b after the heating process is completed. In one embodiment, the actuator 108 may be a step motor, a server motor or a cylinder. A second window 109 is provided on the sidewall of the cooling chamber 102b for the semiconductor workpiece to be transferred out of the cooling chamber. A top piece 101, which comprises a fluid distribution system and provides required fluid into the cooling chamber, is shown at the top of the cooling chamber 102b. The retractable door 103 is driven by an actuator 104 to move into the chambers and retract out of the chambers. In one embodiment, the actuator 104 can be implemented by a cylinder. It should be noticed that according to the present invention, the retractable door 103 will only move in between the chambers when a heating process or a cooling process is performed. The retractable door 103 also provides an additional heating source and an additional cooling source so as to realize a double-side thermal treatment process to the semiconductor workpieces. According to one embodiment, the fixed heating member in the heating chamber is heating coils or other heating means, and additional cooling source is a cooling coil with a coolant being circulated through the cooling coil to remove heat out from the semiconductor workpiece.

Figure 2:
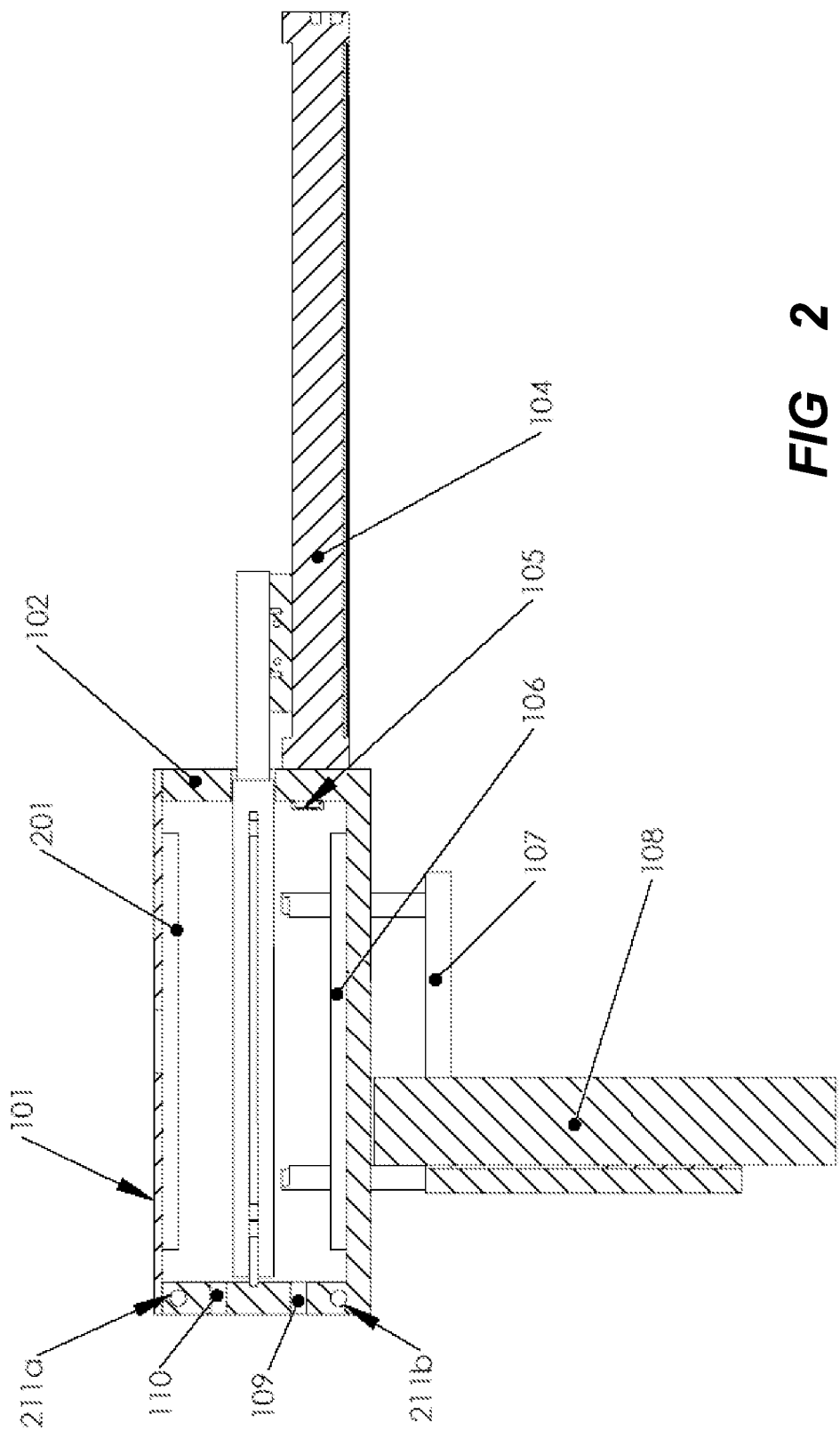
FIG. 2 illustrates a side view of a thermal treatment apparatus with two thermal treatment chambers vertically arranged with a retractable door therebetween.

Referring to FIG. 2, which illustrates a side view of a thermal treatment apparatus with a heating chamber and a cooling chamber vertically arranged with a retractable door therebetween. Tunnels 211a and 211b shown in FIG. 2 are used for a heat exchange means in the wall of the heating chamber 102a and in the wall of the cooling chamber 102b. The heat exchange is by means of circulating water or other fluids at a fixed temperature.

Also referring to FIG. 2, the fixed heating member 106 is shown at the bottom of the heating chamber 102a. The semiconductor workpiece can be transported by the vertical transportation mechanism 107, put on the fixed heating member 106, and heated from the back side by the fixed heating member with a conductive heat transfer mechanism. According to one embodiment, the fixed heating chamber 106 in the heating chamber 102a is heating coils or other heating means. A fixed cooling member 201 is shown at the top of the cooling chamber 102b. In one embodiment, the fixed cooling member 201 is assembled on the bottom surface of the top piece 101. The fixed cooling member 201 cools the semiconductor workpiece with a convective heat transfer mechanism by flowing cold fluid to the front side of the workpiece through cooling member 201. In contrast to the fixed heating member 106, the fixed cooling member 201 does not touch the semiconductor workpiece itself. The fixed cooling member 201 can be implemented as a perforated plate. According to one embodiment, the fixed cooling member 201 is a cool fluid distribution means and the fluid used in the cool fluid distribution means is selected from a group comprising at least: an inert gas, a mixture of inert gases or a mixture of inert gases and reductive gases, wherein the fluid mixture comprising 90-100% of inert gases and 0-10% of reductive gases. And the inert gases are selected from a group comprising at least: argon, helium, nitrogen or other inert gases, and the reductive gases is selected from a group comprising at least: hydrogen or other reductive gases.

Figure 4A:
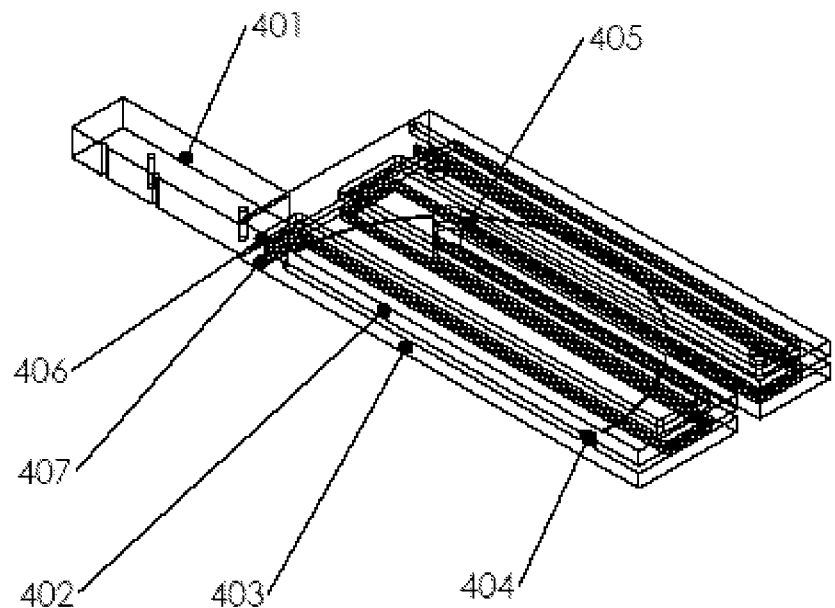
FIG. 4A and FIG. 4B illustrate the isometric and top view of the retractable door.
Figure 4B:
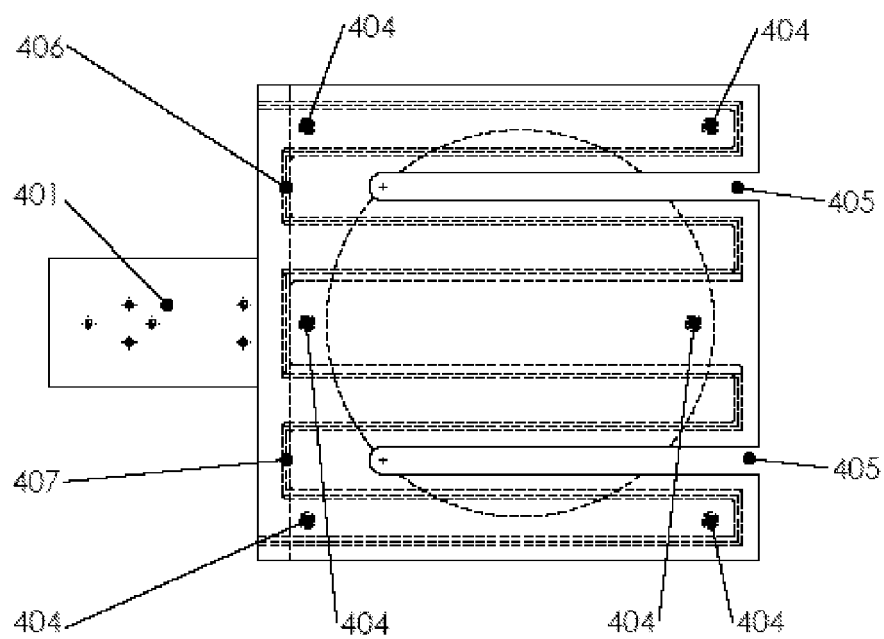

As mentioned above, the retractable door 103 of the present invention also provides an additional heating source and an additional cooling source during the heating and cooling process. Referring to FIG. 4A and FIG. 4B, which illustrate the structures of the retractable door, the retractable door connects to the actuator 104 through a connector 401. The retractable door has a plurality of slots 405 to fit the vertical transportation mechanism 107. For example, the vertical transportation mechanism 107 has a plurality of pins for supporting the semiconductor workpiece, and the slots 405 are used to fit the pins when the retractable door 103 moves into or retracts out of the chambers.

Back to FIG. 4A and FIG. 4B, the retractable door 103 shown in this embodiment comprises two layers, a cooling layer 402 at the upper side of the retractable door and a heating layer 403 at the lower side of the retractable door, the cooling layer 402 and the heating layer 403 are connected by connectors, for example, a plurality of pins 404 as shown in FIG. 4A and FIG. 4B. Also as shown in FIGS. 4A and 4B, a gap is shown being placed between the heating layer 403 and the cooling layer 402. Additional cooling source 406 is embedded in the cooling layer 402 and additional heating source 407 in the heating layer 403 for cooling and heating the semiconductor workpiece. A depression slightly larger than the semiconductor workpiece is provided on the upper surface of the cooling layer for containing the semiconductor workpiece. In one embodiment, the additional cooling source 406 and the additional heating source 407 can be tunnels with cooling or heating liquids to flow through. In one embodiment, the cooling layer 402 comprises a cooling coil with a coolant being circulated through the cooling coil to act as the additional cooling source 406, the coolant being circulated through the cooling coil also removes heat out from the semiconductor workpiece.

It should be noticed that, the position of the cooling layer and the heating layer is reversible. According to the embodiment of FIG. 4A and FIG. 4B, the cooling chamber 102b is positioned above the heating chamber 102a, and the retractable door 103 is positioned in between the two chambers Thus, the fixed heating member is at the bottom of the heating chamber, that is, under the retractable door, and the fixed cooling member is at the top of the cooling chamber, that is, over the retractable door. The cooling layer should be set at the side facing the fixed cooling member and the heating layer should be set at the side facing the fixed heating member. For one of the ordinary skilled in the art, it should be obvious that the present invention shall cover the range of:

The retractable door has a heating layer being positioned at the surface facing to a fixed heating member in the heating chamber, and a cooling layer being positioned at the surface facing to a fixed cooling member in the cooling chamber. Or, if the retractable door has a multi-layer structure (more layers than shown in FIG. 4A and FIG. 4B), the multi-layer structure shall be constructed as follows: the most outer surface facing to the fixed cooling member is a cooling layer; and the most outer surface facing to the fixed heating member is a heating layer, the cooling layer and the heating layer is not directly touched, a gap or additional layers shall be set between them.

According to the embodiment shown in FIG. 4A and FIG. 4B, during a cooling process, the retractable door moves in between the heating and cooling chambers. The additional cooling source 406 embedded in the cooling layer 402 not only provides an additional cooling source to the semiconductor workpiece, but also removes the heat from the heating chamber. Thus the semiconductor workpiece can be cooled efficiently. For example, in the embodiment that the cooling layer 402 comprises a cooling coil with a coolant being circulated through the cooling coil to act as the additional cooling source 406, the coolant being circulated through the cooling coil also removes heat out from the semiconductor workpiece.

Figure 5:
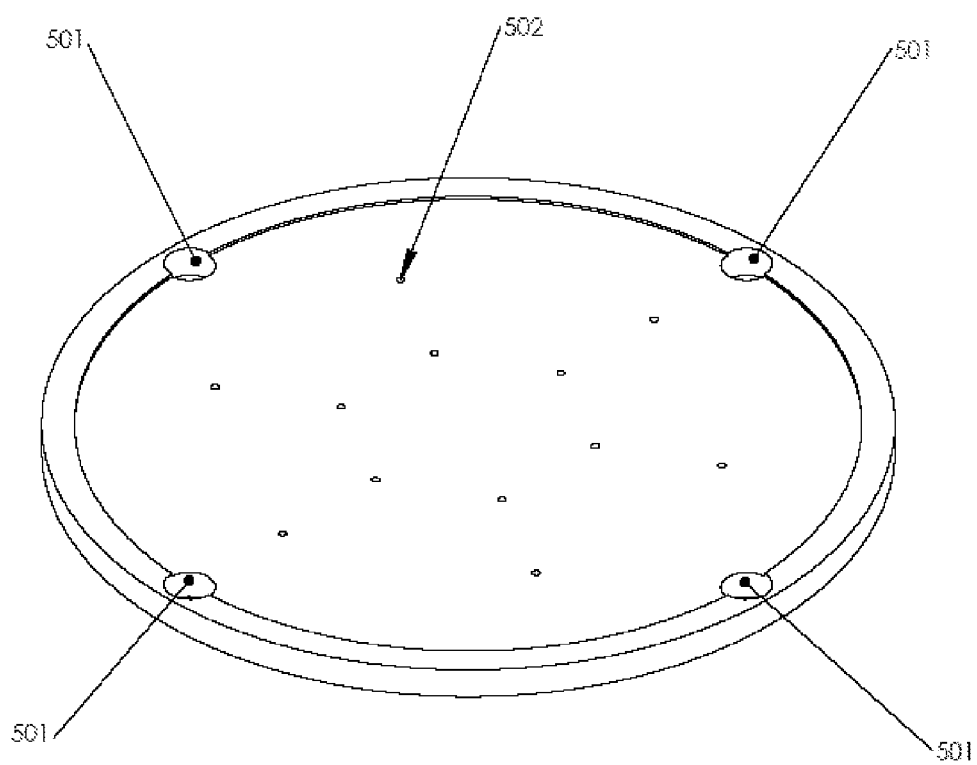
FIG. 5 illustrates an isometric view of a fixed heating member in the heating chamber.

Referring to FIG. 5, which illustrates an isometric view of a fixed heating member in the heating chamber. The fixed heating member has a circular plate with a first type of holes 501 and a second type of holes 502 on it. The first type of holes 501 is used for the pins of the vertical transportation mechanism 107 to go through and transport the semiconductor workpiece. And the second type of holes 502 are connected to a vacuum system for vacuum chuck of semiconductor workpiece. The position of the first type of the holes 501 is corresponding to the position of the pins, and usually, the first type of the holes 501 are located at the edge of the fixed heating member. A depression slightly larger than the semiconductor workpiece is provided on the upper surface of the fixed heating member to containing the semiconductor workpiece.

Figure 3:
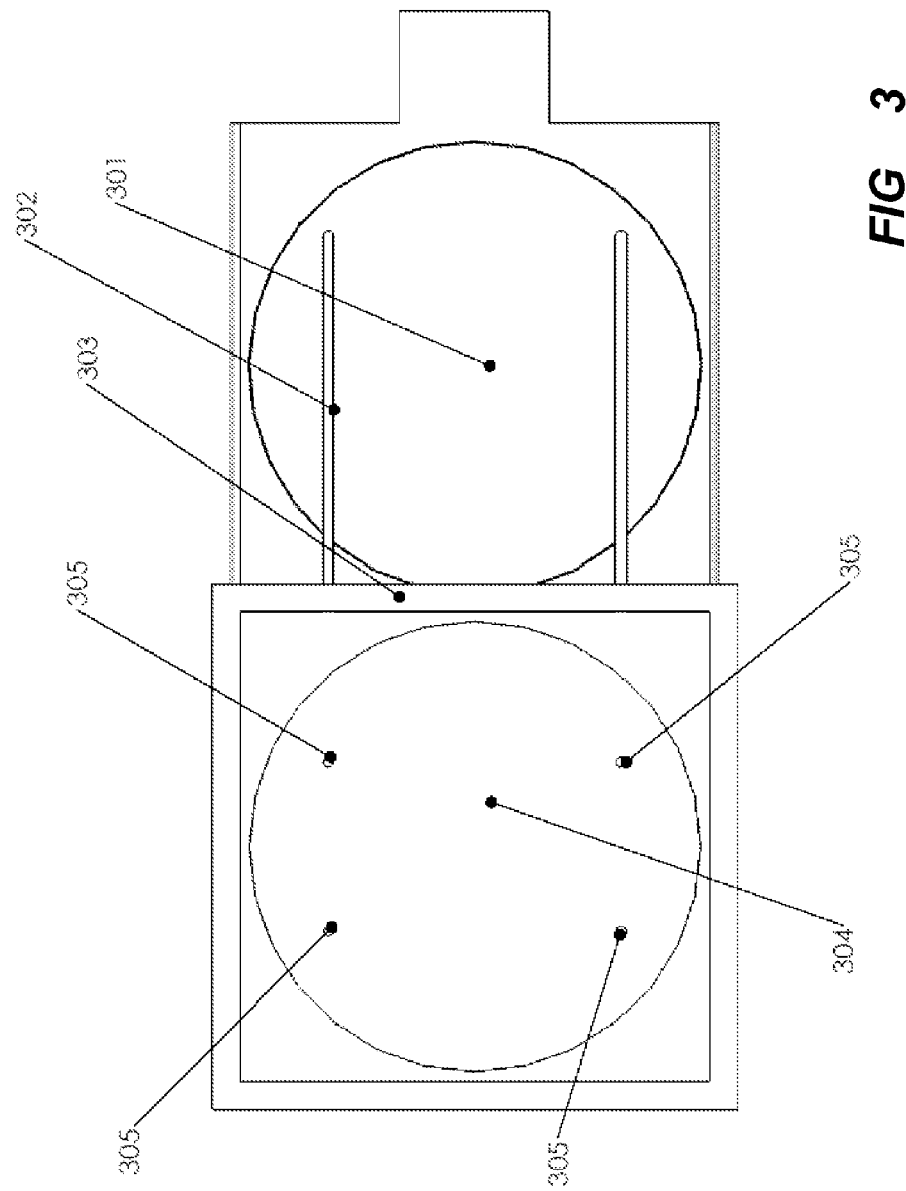
FIG. 3 illustrates the method in which the retractable door moves into and retracts out of the chambers.

FIG. 3 illustrates the method in which the retractable door moves into and retracts out of the chambers. In the embodiment shown in FIG. 3, the retractable door 301 moves into or retracts out of the chambers through a door port 303. The retractable door 301 has the similar structure as the retractable door shown in FIG. 4A and FIG. 4B. There are slots 302 on the retractable door 301 for the pins 305 of the vertical transportation mechanism to go through when the door 301 moves. Numeral 304 denotes the fixed heating member. In this embodiment, the retractable door is a single piece.

Figure 6:
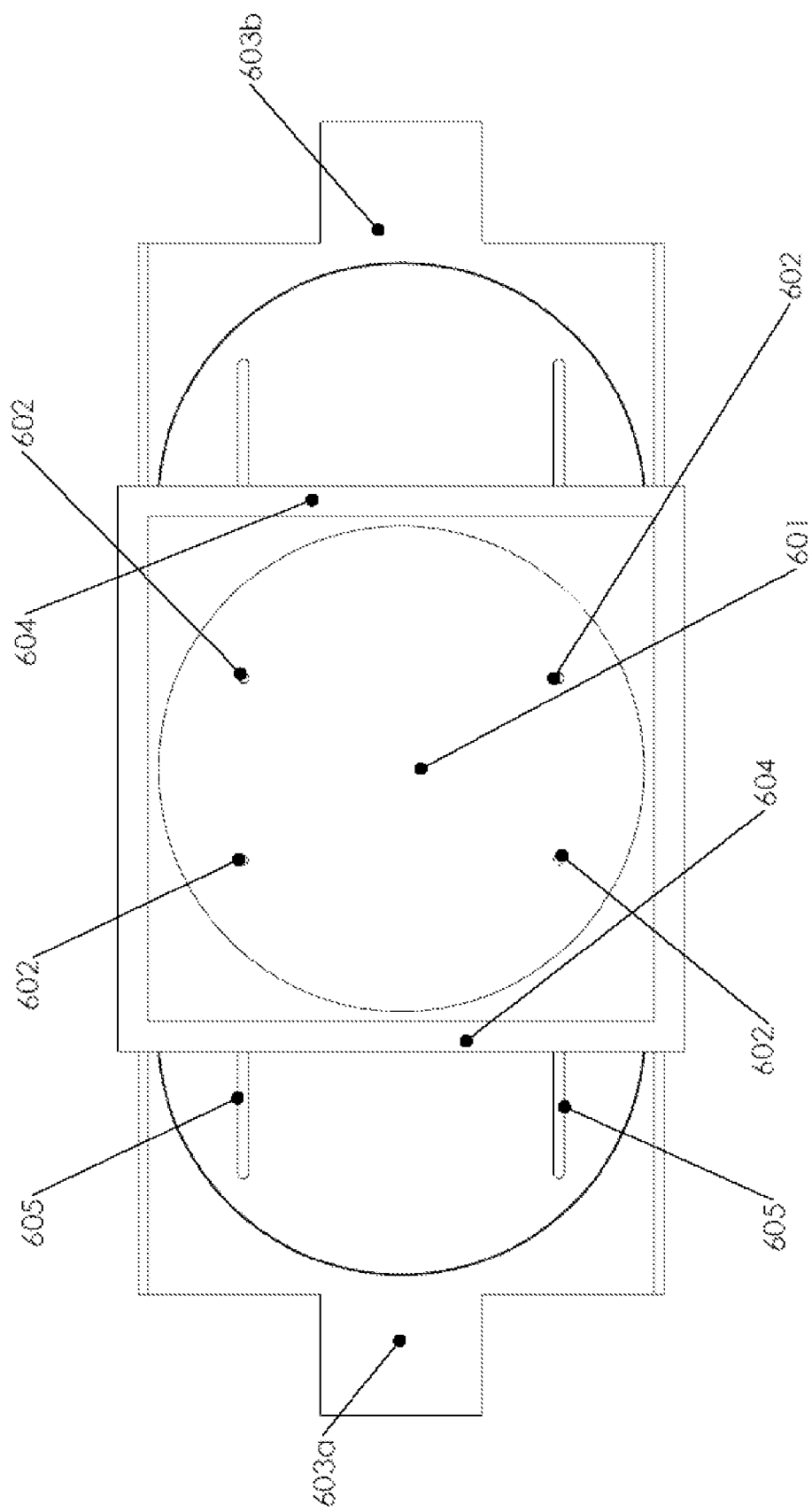
FIG. 6 illustrates the method that a retractable door with two separate parts moves into and retracts out of the chambers.
Figure 7:
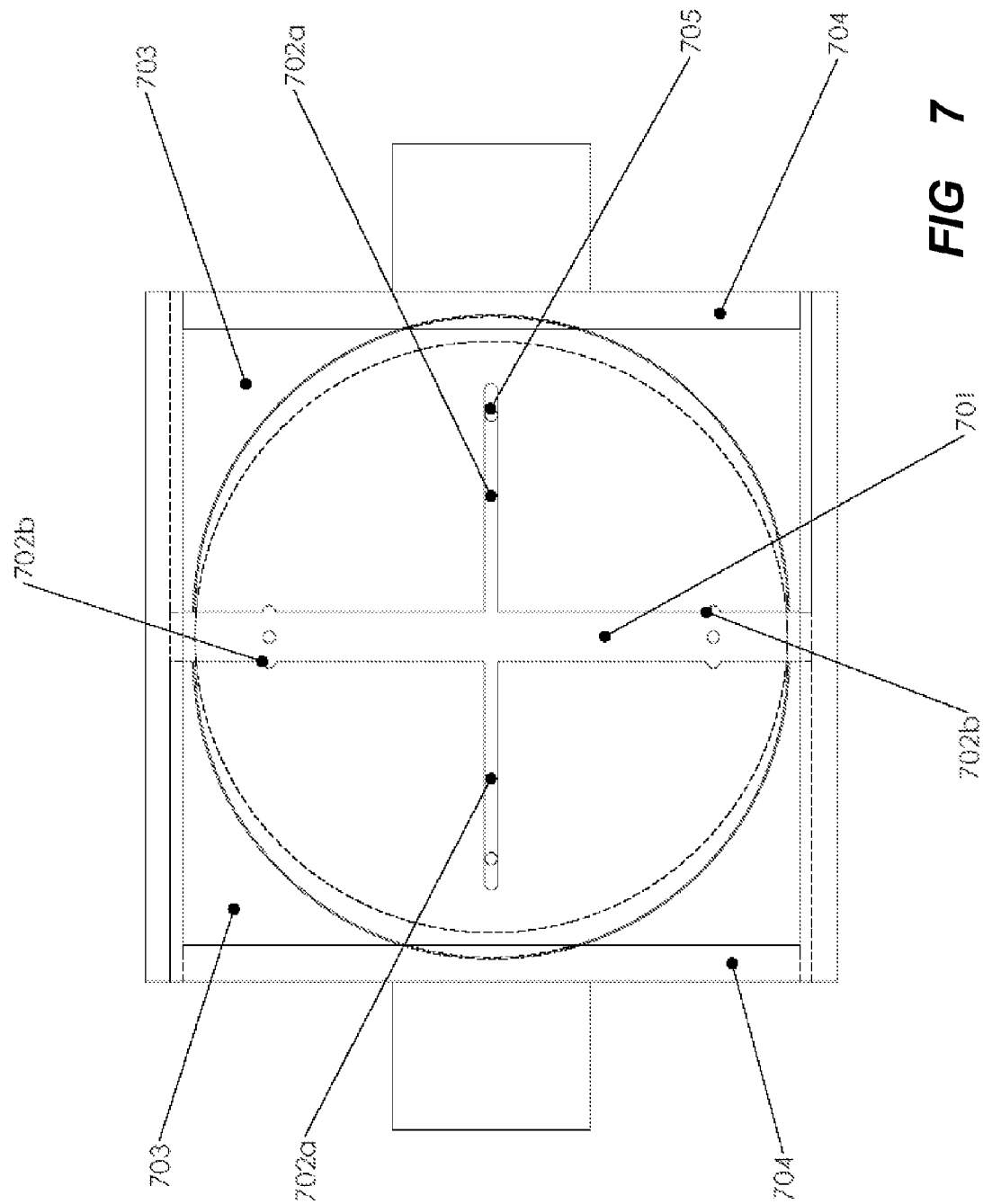
FIG. 7 illustrates another method that a retractable door with two separate parts moves into and retracts out of the apparatus.

Referring to FIG. 6 and FIG. 7, wherein FIG. 6 illustrates the method that a retractable door with two separate parts moves into and retracts out of the chambers and FIG. 7 illustrates another way that a retractable door with two separate parts moves into and retracts out of the apparatus.

According to FIG. 6, the retractable door has two parts 603a and 603b. They may be driven by two actuators (not shown) to move into or out of the chambers. The control principle of the two actuators are the same as the one actuator 104 mentioned above, so one of the ordinary skilled in the art can carry out this embodiment based on the descriptions here without doubt. Back to FIG. 6, each part 603a and 603b of the retractable door has two slots 605. Each of the slots 605 fits a single pin 602 when the door moves into or out of the chambers. The two parts 603 of the retractable door moves into the chambers from opposite directions through two door ports 604.

FIG. 7 illustrates a different design of the retractable door. As shown in FIG. 7, the retractable door has two parts 703 driven by two actuators (not shown) to move into or out of the chambers. Each of the parts 702 has only one slot 702a and two concaves 702b to fit the pins 705. As shown in FIG. 7, when the door moves, two pins will go through the slots 702a and the other two pins will be enclosed by the concaves from the two parts 703 without touching. Thus, only two small concaves, slightly bigger than the half of the cross section of the pins, are needed on the two parts 703 of the door. Similar to FIG. 6, the two parts 703 of the retractable door also moves into the chambers from opposite directions through two door ports 704.

According to one embodiment, the thermal treatment apparatus performs a preheating and precooling process before a heating or cooling process starts. For the preheating process, when the semiconductor is transported into the heating chamber, it will be kept between the fixed heating member and the heating layer for a moment. The fixed heating member and the heating layer heat the front side and the back side of the semiconductor workpiece simultaneously during the preheating process, both through the convective heat transfer mechanism. Similarly, the semiconductor workpiece will be precooled before the cooling process. However, in one embodiment, the precooling process is performed in a matter similar to the preheating process, and in another embodiment, the precooling process can be performed when the semiconductor workpiece is transported from the heating chamber into the cooling chamber.

Second Embodiment of the Apparatus

In the first embodiment, the upper chamber in the vertically arranged chambers is a cooling chamber and the lower chamber is a heating chamber. In another embodiment, the upper chamber is a heating chamber and the lower chamber is a cooling chamber. Now referring to FIG. 8, which illustrates a disassembled view of another thermal treatment apparatus with a heating chamber and a cooling chamber vertically arranged.

Figure 8:
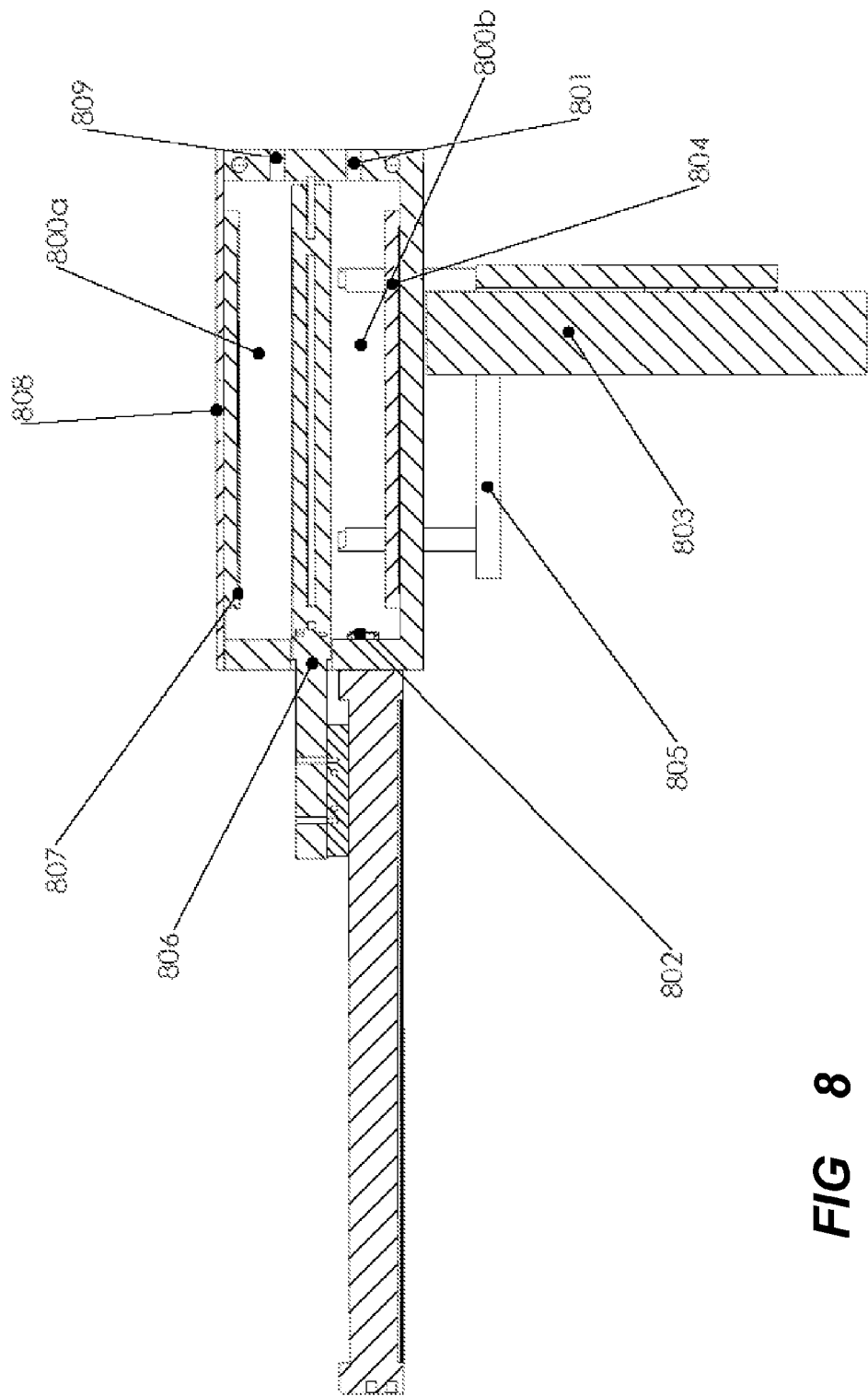
FIG. 8 illustrates a side view of another thermal treatment apparatus with a heating chamber and a cooling chamber vertically arranged.

As shown in FIG. 8, the thermal apparatus 800 comprises vertically arranged heating chamber 800a and cooling chamber 800b. In the embodiment shown in FIG. 8, the heating chamber 800a is positioned above the cooling chamber 800b with a retractable door between them. A fixed cooling member 804 is set at the base of the cooling chamber which is kept at a constant temperature. A first window 801 is set on the sidewall of the cooling chamber 800b for the semiconductor workpiece to be transferred out of the cooling chamber. A fluid distribution part 802 is also provided in the cooling chamber 800b to provide required fluid during the cooling process. A vertical transportation mechanism 803 is shown at the bottom of the cooling chamber. The vertical transportation mechanism 803 comprises a plurality of pins 805, at least 3 pins to transport and position the semiconductor workpiece. The vertical transportation mechanism 806 is controlled by an actuator (not shown, but work as the same principle of the actuator 108 mentioned above) for transporting and positioning the semiconductor workpiece. The actuator controls the vertical transportation mechanism 803 to lift down the semiconductor workpiece from the heating chamber 800a into the cooling chamber 800b after the heating process is completed. In one embodiment, the actuator may be a step motor, a server motor or a cylinder. A second window 809 is provided on the sidewall of the heating chamber 800a for the semiconductor workpiece to be transferred into the heating chamber. A top piece 808, which comprises a fluid distribution system and provides required fluid into the heating chamber 800a is shown at the top of the heating chamber 800a. The retractable door 806 is driven by an actuator to move into the chambers and retract out of the chambers. In one embodiment, the actuator can be implemented by a cylinder. It should be noticed that according to the present invention, the retractable door 806 will only move in between the chambers when a heating process or a cooling process is performed. The retractable door 806 also provides an additional heating source and an additional cooling source so as to realize a double-side heating or cooling process to the semiconductor workpieces.

Also referring to FIG. 8, the fixed cooling member 804 is shown at the bottom of the cooling chamber 800b. The semiconductor workpiece can be transported by the vertical transportation mechanism 803, put on the fixed cooling member 804 and cooled by the fixed cooling member through a conductive heat transfer mechanism. Also, a fixed heating member 807 is shown at the top of the heating chamber 800a. In one embodiment, the fixed heating member 807 is assembled on the bottom surface of the top piece 808. The fixed heating member 807 heats the semiconductor workpiece through a convective heat transfer mechanism by flowing hot fluid to the front side of the semiconductor workpiece.

Since the position of the heating chamber and the cooling chamber is different in the second embodiment with that of the first embodiment, the structure of the fixed heating member and the cooling member in the second embodiment are also a bit different. In the second embodiment, the fixed cooling member in the cooling chamber is cooling coils or other cooling means, and the fixed heating member in the heating chamber is a heat fluid distribution means, or heat gas distribution means.

As mentioned above, the retractable door 806 of the present invention also provides an additional heating source and an additional cooling source during the heating and cooling process. As mentioned above, when the position of the heating chamber and the cooling chamber changes, the structure of the retractable door also changes correspondingly. The design of the present invention should be: the retractable door has a heating layer being positioned at the surface facing to a fixed heating member in the heating chamber, and a cooling layer being positioned at the surface facing to a fixed cooling member in the cooling chamber. A gap is also provided between the cooling layer and the heating layer. If the retractable door has a multi-layer structure, the multi-layer structure shall be constructed as follows: the most outer surface facing to the fixed cooling member is a cooling layer; and the most outer surface facing to the fixed heating member is a heating layer. The cooling layer and the heating layer is not directly touched, a gap or additional layers shall be set between them.

For the structure of the retractable door 806, it is similar to the retractable door 103, so FIG. 4A and FIG. 4B will be used to illustrate the description of the door 806. However, it should be noticed that, the position of the cooling layer and the heating layer are changed, so the numerals in FIG. 4A and FIG. 4B are not suitable for the descriptions in this embodiment. In the embodiment of FIG. 8, the cooling chamber 800b is put under the heating chamber 800a, and the retractable door 806 is positioned between the two chambers. Thus, the fixed heating member is at the top of the heating chamber, that is, above the retractable door, and the fixed cooling member is at the bottom of the cooling chamber, that is, under the retractable door. The cooling layer should be set at the side facing the fixed cooling member and the heating layer should be set at the side facing the fixed heating member. Similar to the structure as FIG. 4A and FIG. 4B, the retractable door 806 may have the following structure: the door 806 comprises two layers, a cooling layer at the lower side of the retractable door and a heating layer at the upper side of the retractable door, the cooling layer and the heating layer are connected by connectors, for example, a plurality of pins. Additional cooling source is embedded in the cooling layer and additional heating source in the heating layer for double-side cooling and heating the semiconductor workpiece.

Other structure of the retractable door 806 is similar as the retractable door 103 as shown in FIG. 4A and FIG. 4B. The retractable door connects to the actuator through a connector. The retractable door has a plurality of slots to fit the vertical transportation mechanism. For example, the vertical transportation mechanism has a plurality of pins for supporting the semiconductor workpiece, and the slots are used to fit the pins when the retractable door moves into or retracts out of the chambers.

During a cooling process, the retractable door moves in between the heating and cooling chambers. The additional cooling source embedded in the cooling layer not only provides an additional cooling source to the semiconductor workpiece, but also removes the heat from the heating chamber. Thus the semiconductor workpiece can be cooled efficiently. Such features are also similar to the first embodiment.

For the second embodiment, the retractable door 806 can also has a plurality of forms. For example, one of the forms is shown by FIG. 3. The retractable door 301 moves into or retracts out of the chambers through a door port 303. There are slots 305 on the retractable door 301 to fit the pins 305 of the vertical transportation mechanism when the door 301 moves. Numeral 304 denotes the fixed heating member. In this embodiment, the retractable door is a single piece.

A second form of the retractable door 806 is shown in FIG. 6, the retractable door has two parts 603a and 603b. They may be driven by two actuators (not shown) to move into or out of the chambers. The control principle of the two actuators are the same as that of the one actuator 104 mentioned above, so one of the ordinary skilled in the art can carry out this embodiment based on the descriptions here without doubt. Back to FIG. 6, each part 603 of the retractable door has two slots 605. Each of the slots 605 is used to fit a single pin 602 when the door moves. The two parts 603 of the retractable door move into the chambers from opposite directions through two door ports 604.

A third form of the retractable door 806 is shown in FIG. 7, the retractable door has two parts 703 driven by two actuators (not shown) to move into or out of the chambers. Each of the parts 703 has only one slot 702a and two concaves 702b for the pins to go through. As shown in FIG. 7, when the door moves, two pins will go through the slots 702a and the other two pins will be enclosed by the concaves 702b from the two parts without touching. Thus, only two small concaves, slightly bigger than the half of the cross section of the pins, are needed on the two parts 703 of the door. Similar to FIG. 6, the two parts 703 of the retractable door also moves into the chambers from opposite directions through two door ports 704.

The second embodiment of the apparatus also performs a preheating and precooling process before a heating or cooling process starts. For the preheating process, when the semiconductor is transported into the heating chamber, it will be kept between the fixed heating member and the heating layer for a moment. The fixed heating member and the heating layer heat the front side and the back side of the semiconductor workpiece simultaneously during the preheating process, both through the convective heat transfer mechanism. Similarly, the semiconductor workpiece will be precooled before the cooling process. However, in one embodiment, the precooling process is performed in a matter similar to the preheating process, and in another embodiment, the precooling process can be performed when the semiconductor workpiece is transported from the heating chamber into the cooling chamber.

It should be noticed that the first embodiment and the second embodiment are only examples of the thermal treatment apparatus with vertically arranged heating and cooling chambers. For one of the ordinary skilled in the art, the following range can be obtained from the present description without doubt. Therefore, the present invention shall not be limited to the embodiment, but along with the scope of the claims.

Based on the descriptions of the first and second embodiments, the apparatus of invention may be concluded as comprising: vertically arranged heating and cooling chambers, a transportation mechanism for transporting a semiconductor workpiece between the heating chamber and the cooling chamber with a retractable door between them. The retractable door at least moves in between the heating chamber and the cooling chamber during a heating process and provides an additional heating source during the heating process. The retractable door has a heating layer being positioned at the surface facing to a fixed heating member in the heating chamber, the fixed heating member provides a fixed heating source while the heating layer provides as an additional heating source during the heating process. The retractable door also moves in between the heating chamber and the cooling chamber during a cooling process and provides an additional cooling source during the cooling process. The retractable door has a cooling layer being positioned at the surface facing to a fixed cooling member in the cooling chamber, the fixed cooling member provides a fixed cooling source while the cooling layer provides an additional cooling source during the cooling process.

The retractable door can move translationally or rotate into the chambers. For the translational movement, FIG. 3, FIG. 6 and FIG. 7 have illustrated a plurality of implementation. For the rotational movement, it is not illustrated by figures; however it is easy to be understood from the description above by one of the ordinary skilled in the art. That means, the a rotational moving mechanism can also be used to drive the retractable door in and out between the heating chamber and the cooling chamber According to the present invention, both the conductive heat transfer mechanism and the convective heat transfer mechanism are utilized and a double-side thermal treatment is achieved.

The thermal treatment apparatus can be applied in the following applications, for example: heat and cool a thin film or a stack of thin films; or anneal metallic or insulative films in semiconductor interconnect; or reflow the solder; or cure and/or bake the polymeric coatings.

Thermal treatment process of vertically arranged heating and cooling chambers

For the first and second embodiments mentioned above, they may perform a thermal treatment process as follows:

providing a heating chamber and a cooling chamber being stacked vertically;

providing a retractable door for separating the heating chamber and the cooling chamber;

providing a fixed heating member at bottom of the heating chamber, and a heating layer at the lower surface of the retractable door;

providing a fixed cooling member at top of the cooling chamber, and a cooling layer at the upper surface of the retractable door;

moving the retractable door in between the heating chamber and cooling chamber and transporting a semiconductor workpiece into the heating chamber;

starting heating processes;

moving the retractable door out between the heating chamber and cooling chamber and transporting the semiconductor workpiece from the heating chamber into the cooling chamber when the heating process completes;

moving the retractable door in between the heating chamber and cooling chamber and starting cooling processes;

transporting the semiconductor workpiece out of the cooling chamber.

An embodiment of the process of the thermal treatment of semiconductor workpieces will be outlined under the circumstance when the structure of the first embodiment is used.

The fluid distribution part 105 turns on and the retractable door 103 moves in between the heating chamber and the cooling chamber. The first window 110 opens and the semiconductor workpiece is transferred into the heating chamber 102*a* by a mechanical transportation means. The semiconductor workpiece is first located at the exchange position by the mechanical transportation means. The pins of the vertical transportation mechanism 107 raise and carry the semiconductor workpiece to the receiving position. Then the mechanical transportation means retracts out of the heating chamber 102*a*. The fluid distribution part 105 keeps on but at a reduced flow rate during this process. The pins of the vertical transportation mechanism 107 move down and carry the semiconductor workpiece to a pre-heating position. The pre-heating position should be: 1) above the fixed heating member 106 so the back side of the semiconductor workpiece can be put on the fixed heating member 106 a bit later; 2) under the retractable door 103 so to the front side of the semiconductor workpiece can be heated by the additional heating source provided by the retractable door 103. The fluid distribution part 105 still keeps on during this process. The semiconductor workpiece stays at the pre-heating position for a period of time while both the fixed heating member 106 and the heating layer of the retractable door 103 heat the semiconductor workpiece by convective heat transfer mechanism. Then the pins of the vertical transportation mechanism 107 move down and place the semiconductor workpiece on the surface of the fixed heating member 106. Vacuum system turns on to chuck the semiconductor workpiece so that its backside is in contact with the fixed heating member. The semiconductor workpiece is then heated on the fixed heating member 106 for a period of time. During this period of time, the semiconductor workpiece is heated by the fixed heating member through a conductive heat transfer mechanism from the back side and by the heating layer of the retractable door 103 through a convective heat transfer mechanism from the front side. When the heating process is completed, the vacuum chuck is off and the semiconductor workpiece is de-chucked. The fluid distribution means 201 on the top piece 101 turns on and the retractable door 103 moves out of the chambers to make the heating chamber and the cooling chamber be connected. Pins of the vertical transportation mechanism 107 then raise and carry the semiconductor workpiece into the cooling chamber 102*b*. The retractable door 103 moves into the chambers again and locates below the semiconductor workpiece to begin a cooling process. The fluid distribution part 105 turns off. When the pins of the vertical transportation mechanism 107 raise, the semiconductor is precooled. In other embodiments, an additional precool process can be performed when the semiconductor workpiece is transported into the cooling chamber.

The fixed cooling member 201, which is a fluid distribution means, keeps on when the semiconductor workpiece is lifted into the cooling chamber 102*b*. Pins of the vertical transportation mechanism 107 move down and place the semiconductor workpiece on the upper surface of the retractable door 103 so that the back side of the semiconductor workpiece is in contact with the cooling layer of the retractable door. The fixed cooling member 201 still keeps on to cool the front side of the semiconductor workpiece by a convective heat transfer mechanism during this process. At the same time the semiconductor workpiece is cooled from the backside on the upper surface of the retractable door 103 by a conductive heat transfer mechanism for a period of time. And during the cooling process, the fluid distribution means 201 keeps on.

When the cooling process is over, pins of the vertical transportation mechanism 107 raise and carry the semiconductor workpiece to the exchange position and the second window 109 opens. Then a mechanical transportation means will receive the semiconductor workpiece and moves it out of the cooling chamber 102*b* from the cooling chamber window 109. Then pins of the vertical transportation mechanism 107 move down to the heating chamber.

Sequential semiconductor workpiece is transferred into the heating chamber for the double-side thermal treatment for the same process as introduced above.

It should be noticed that the thermal treatment process listed above is only an example of the thermal treatment process provided by the present invention. For one of the ordinary skilled in the art, the following range can be obtained from the present description without doubt. Therefore, the present invention shall not be limited to the embodiment, but along with the scope of the claims.

Based on the descriptions of the embodiments of the apparatus and the process embodiment, the method for thermal treatment process of a semiconductor workpiece may be concluded as comprising at least: providing a heating chamber and a cooling chamber being stacked vertically; providing a retractable door for separating the heating chamber and the cooling chamber; providing a fixed heating member at bottom of the heating chamber, and a heating layer at the lower surface of the retractable door; providing a fixed cooling member at top of the cooling chamber, and a cooling layer at the upper surface of the retractable door; moving the retractable door in between the heating chamber and cooling chamber and transporting a semiconductor workpiece into the heating chamber; starting heating processes; moving the retractable door out between the heating chamber and cooling chamber and transporting the semiconductor workpiece from the heating chamber into the cooling chamber when the heating process completes; moving the retractable door in between the heating chamber and cooling chamber and starting cooling processes; transporting the semiconductor workpiece out of the cooling chamber.

The retractable door has a heating layer being positioned at the surface facing to a fixed heating member in the heating chamber, the fixed heating member provides a fixed heating source for conductive heating of the back side of the semiconductor workpiece while the heating layer provides as an additional heating source for convective heating of the front side of the semiconductor workpiece during the heating process. The retractable door also has a cooling layer being positioned at the surface facing to a fixed cooling member in the cooling chamber, the fixed cooling member provides a fixed cooling source for convective cooling of the front side of the semiconductor workpiece while the cooling layer provides an additional cooling source for conductive cooling of the backside of the semiconductor workpiece during the cooling process.

According to the present invention, both the conductive heat transfer mechanism and the convective heat transfer mechanism are utilized and a double-side thermal treatment to semiconductor workpiece is realized.

The thermal treatment method can be applied in the following application, for example: heat and cool a thin film or a stack of thin films; or annealing metallic or insulative films in semiconductor interconnect; or reflow the solder; or cure and/or bake the polymeric coatings.

Third Embodiment of the Apparatus

Figure 10:
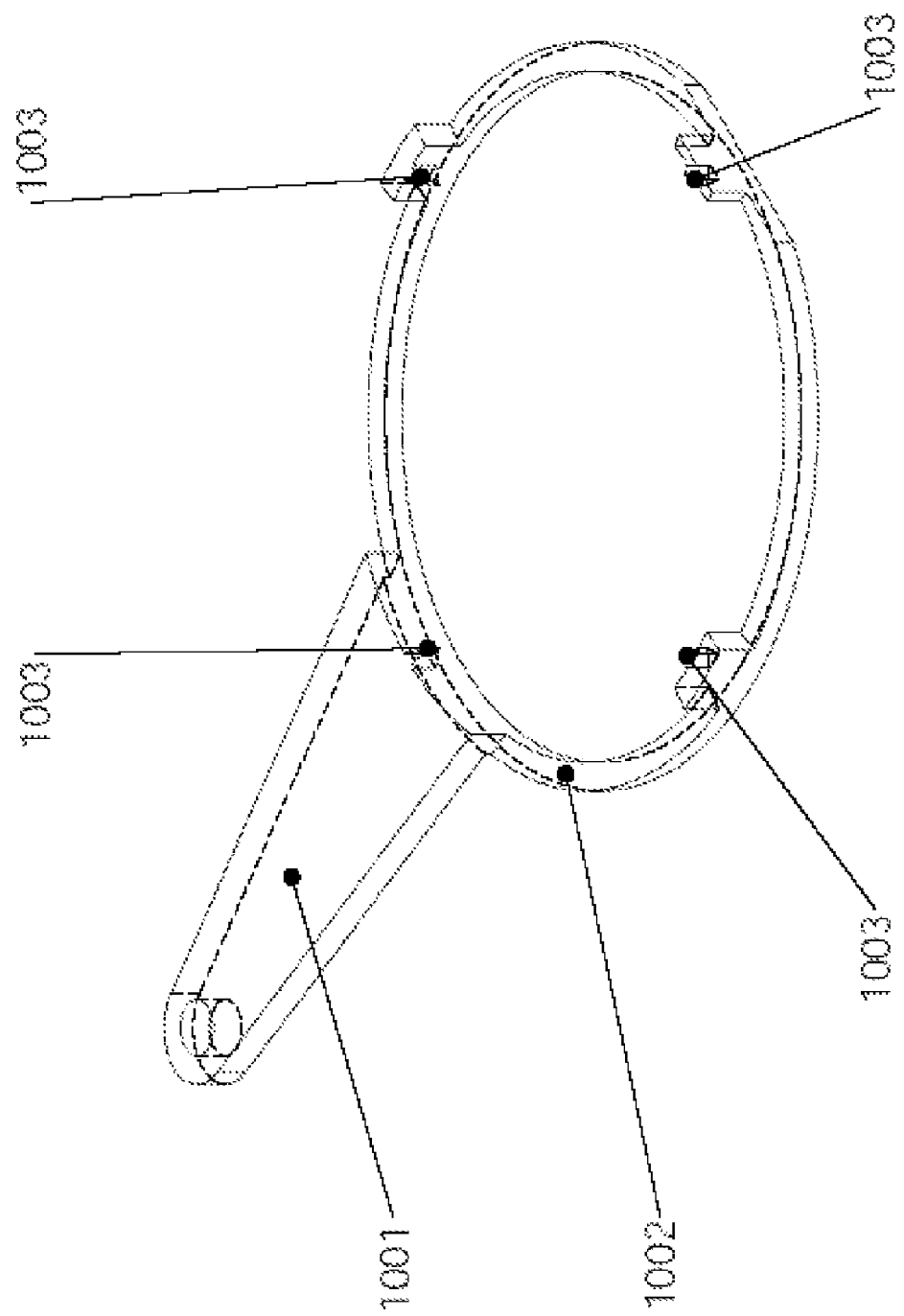
FIG. 10 illustrates an isometric view of a semiconductor workpiece transportation device.

According to another aspect of the present invention, providing an apparatus comprising a heating chamber and a cooling chamber be arranged horizontally adjacent to each other, with a retractable door between the heating and cooling chambers. The retractable door moves in between the heating and cooling chambers during a heating process. An additional heating source for heating the semiconductor workpiece is provided in the heating chamber. Thus, the semiconductor workpiece is heated from double sides by a fixed heating source and an additional heating source. The apparatus also comprises a horizontal semiconductor workpiece transfer mechanism to support and transfer semiconductor workpiece between the heating chamber and the cooling chamber. The horizontal semiconductor workpiece transfer mechanism may comprise at least one semiconductor workpiece transfer device. FIG. 10 illustrates an isometric view of a transfer device, which has an arm 1001 connected to an actuator and a support ring 1002 with a plurality of fingers 1003 to hold the semiconductor workpiece on the transfer device. The transfer device is controlled by an actuator for rotating and vertical movement. The actuator comprises two motors, each to control one kind of motion of the transfer device. In one embodiment, the semiconductor workpiece transfer mechanism comprises one transfer device, and in another embodiment, the semiconductor workpiece transfer mechanism comprises two transfer devices, each is controlled by an actuator respectively.

According to one embodiment, a transfer device comprises 3 supporting fingers, and the angle between the line across the rotating axis of one transfer device and the center of the heating plate and the line across the rotating axis of the other transfer device and the center of the heating plate is 120°. In another embodiment, the transfer device comprises 4 supporting fingers, and the angle between the line across the rotating axis of one transfer device and the center of the heating plate and the line across the rotating axis of the other transfer device and the center of the heating plate is 90°. In a third embodiment, the transfer device comprises 5 supporting fingers, and the angle between the line across the rotating axis of one transfer device and the center of the heating plate and the line across the rotating axis of the other transfer device and the center of the heating plate is 144°. In a fourth embodiment, the transfer device comprises 6 supporting fingers, and the angle between the line across the rotating axis of one transfer device and the center of the heating plate and the line across the rotating axis of the other transfer device and the center of the heating plate is 120°.

Figure 9:
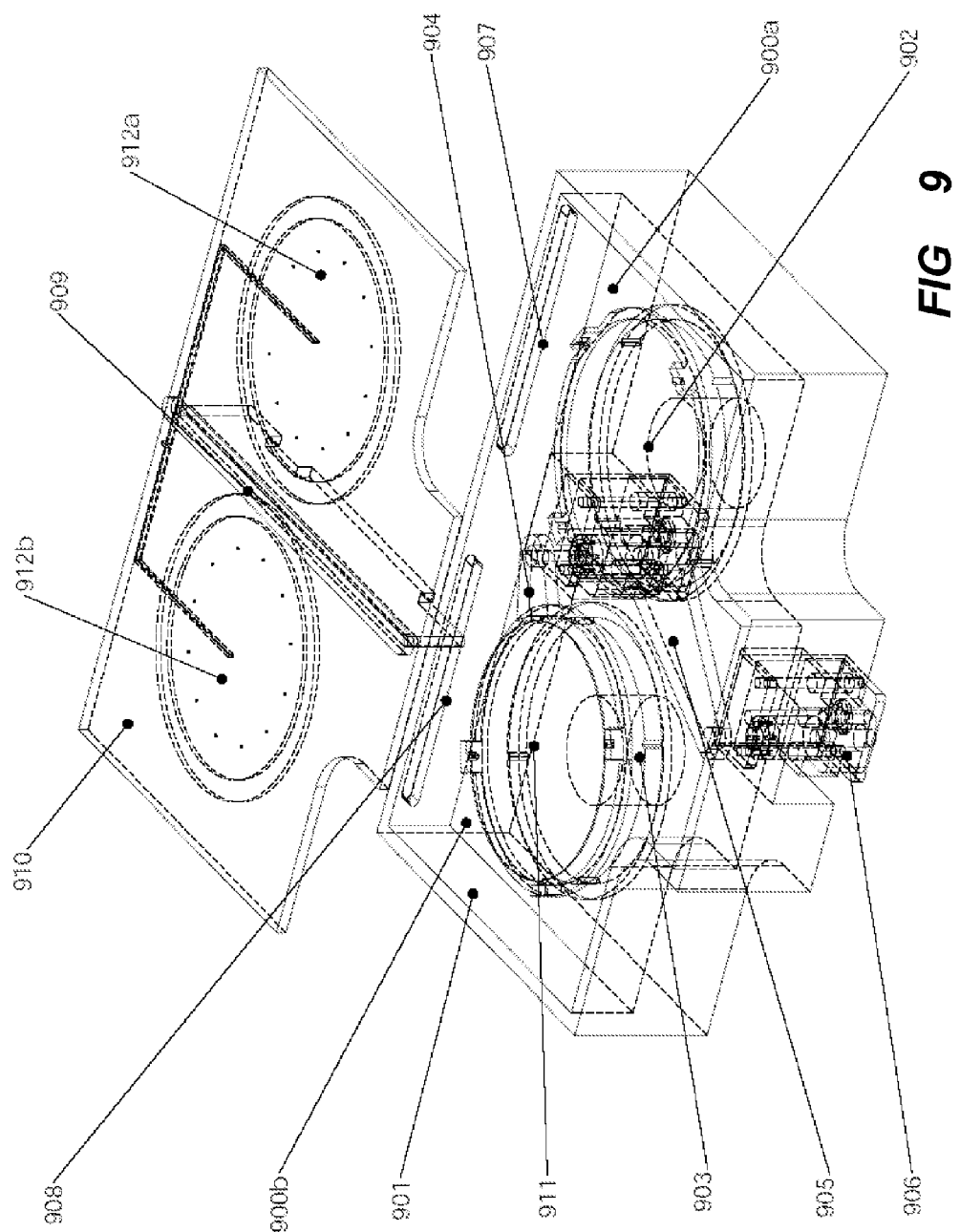
FIG. 9 illustrates a view of a disassembled thermal treatment apparatus with two thermal treatment chambers positioned horizontally with a retractable door therebetween.

Back to the thermal treatment apparatus. As shown in FIG. 9, which illustrates an isometric view of a thermal treatment apparatus with a heating chamber and a cooling chamber positioned horizontally with a retractable door therebetween. The thermal treatment apparatus 900 comprises a heating chamber 900a and a cooling chamber 900b positioned adjacent to each other horizontally. A first heating member, as a heating plate 902, is set at the base of the heating chamber 900a, which is kept at a constant temperature. The heating plate 902 may comprise a heating coil. A first cooling member, as a heating plate 903, is set at the base of the heating chamber 900b, which is kept at a constant temperature. The cooling plate 903 may comprises a cooling coil. A first window 907 is set on the sidewall 901 of the heating chamber 900a for the semiconductor workpiece to be transferred into the heating chamber 900a. A fluid distribution part 912a is also provided in the heating chamber 900a to provide required fluid during the heating process. A group of transfer devices 904 and 905 are provided to support and transfer the semiconductor workpiece between the heating and cooling plates. As shown in FIG. 9, numeral 904 and 905 denote the transfer device while numeral 911 denotes the support ring of the transfer device. Two transfer devices 904 and 905 are controlled by two actuators, one of which is 906 for transporting and positioning the semiconductor workpiece. According to one embodiment, the transfer device 904 and 905 can rotate and vertically move. When the cooling process is completed, the semiconductor workpiece is transported out of the cooling chamber by the transport devices through a second window 908 on the sidewall 901 of the cooling chamber.

The heating chamber 900a and the cooling chamber 900b have a top piece 910, which comprises fluid distribution parts 912a and 912b in the lower surface of the workpiece. The heating fluid distribution part 912a provides hot required fluid to the heating chamber 900a and the cooling fluid distribution part 912b provides cool required fluid to the cooling chamber 900b. The heating fluid distribution part and the cooling fluid distribution part are utilized as additional heating and cooling sources during a heating or cooling process. The work principal of the fluid distribution parts 912a and 912b is similar to the fluid distribution parts in the first and second embodiment of the thermal treatment apparatus. And the fluid that is used is also similar to the above embodiments.

The retractable door 909 moves in between the heating and cooling chambers when a heating process or a cooling process is initiated.

According to the embodiment shown in FIG. 9, the heating chamber 900a and the cooling chamber 900b can work simultaneously. For example, a first semiconductor workpiece can be heated in the heating chamber first, and then the first semiconductor workpiece is transferred by the one transfer device to the cooling chamber for a cooling process, at the same time a second semiconductor workpiece can be transferred into the heating chamber and begin a heating process by another transfer device. The retractable door 909 will only retract when the semiconductor workpiece is being transferred between the chambers, and at any other time, the retractable door 909 moves in between the two chambers. According to an embodiment, the retractable door 909 has a heat exchange means embedded in and removes the heat from the heating chamber to keep its temperature equal to the temperature of chamber walls.

According to the embodiment of FIG. 9, in both heating chamber 900a and cooling chamber 900b, the heating plate 902 and the cooling plate 903 apply a conductive heat transfer mechanism to the back side of the semiconductor workpiece, while the heating fluid distribution means and the cooling fluid distribution means apply a convective heat transfer mechanism to the front side of the semiconductor workpiece. Therefore, double-side thermal treatment on the semiconductor workpiece is realized in both the heating process and the cooling process. In one embodiment, the semiconductor workpirce is preheated and precooled before a heating or cooling process starts. During the preheating or precooling process, both the heating/cooling plates and the heating/cooling fluid distribution means perform a convective heat transfer mechanism.

Based on the above descriptions of the third embodiment, the thermal treatment apparatus with horizontally arranged chambers may be concluded as comprising at least: horizontally adjacent heating and cooling chambers; a transportation mechanism for transporting a semiconductor workpiece between the heating chamber and the cooling chamber; a retractable door between the heating chamber and the cooling chamber; the retractable door moves in between the heating chamber and the cooling chamber during a heating process; and the heating chamber provides an additional heating source during the heating process; the retractable door also moves in between the heating chamber and the cooling chamber during a cooling process; and the cooling chamber provides an additional cooling source during the cooling process.

The heating chamber has an second heating member being positioned at the side facing to a first heating member in the heating chamber, the first heating member provides a first heating source for conductive heating of the back side of the semiconductor workpiece and the second heating member provides an additional heating source for convective heating of the front side of the semiconductor workpiece during the heating process. The cooling chamber has an second cooling member being positioned at the side facing to a first cooling member in the cooling chamber, the first cooling member provides a first cooling source for conductive cooling of the back side of the semiconductor workpiece and the second cooling member provides an additional cooling source for convective cooling of the front side of the semiconductor workpiece during the cooling process.

Figure 11:
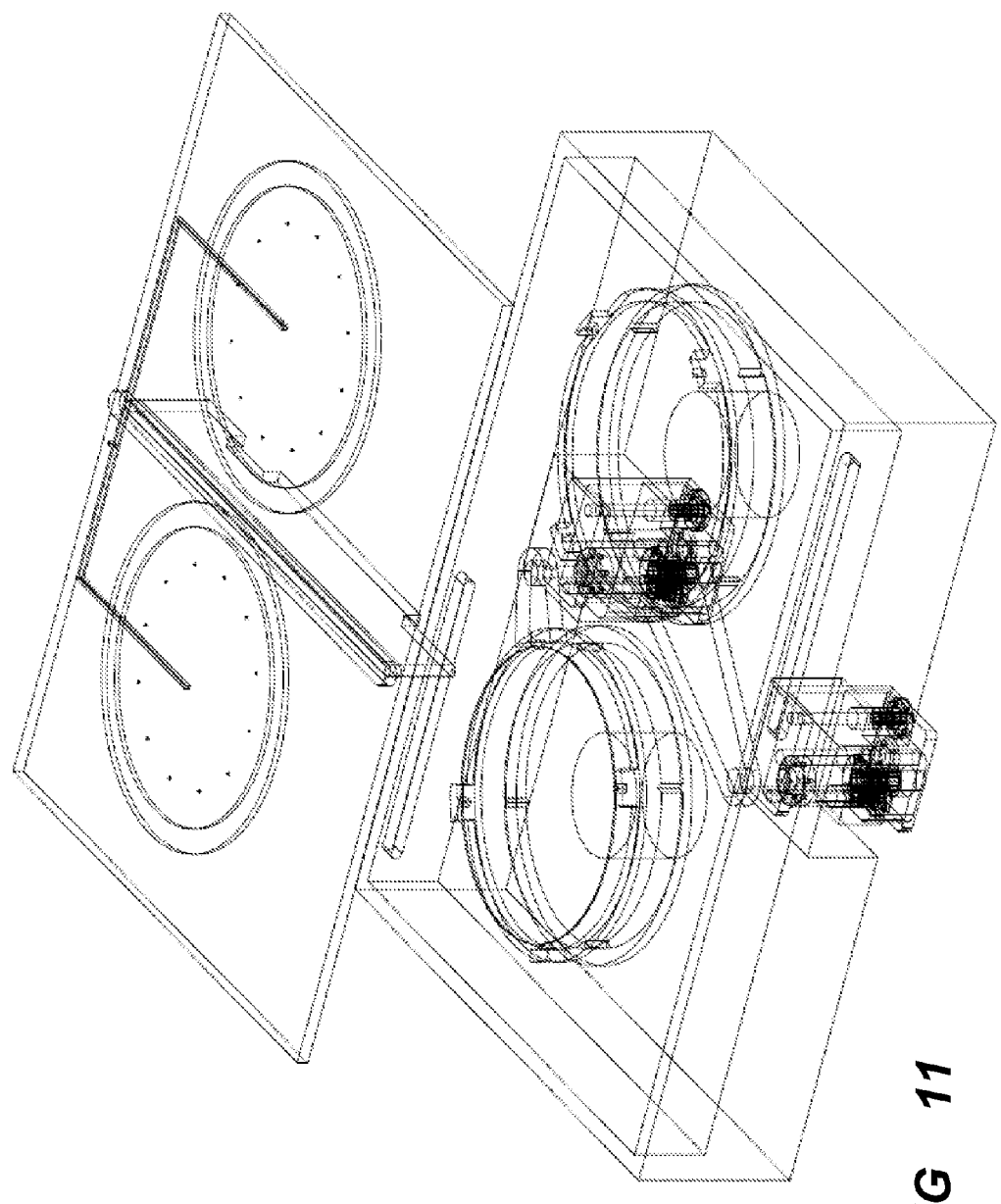
FIG. 11 illustrates a view of another disassembled thermal treatment apparatus with two thermal treatment chambers positioned horizontally with a retractable door therebetween.
Figure 12:
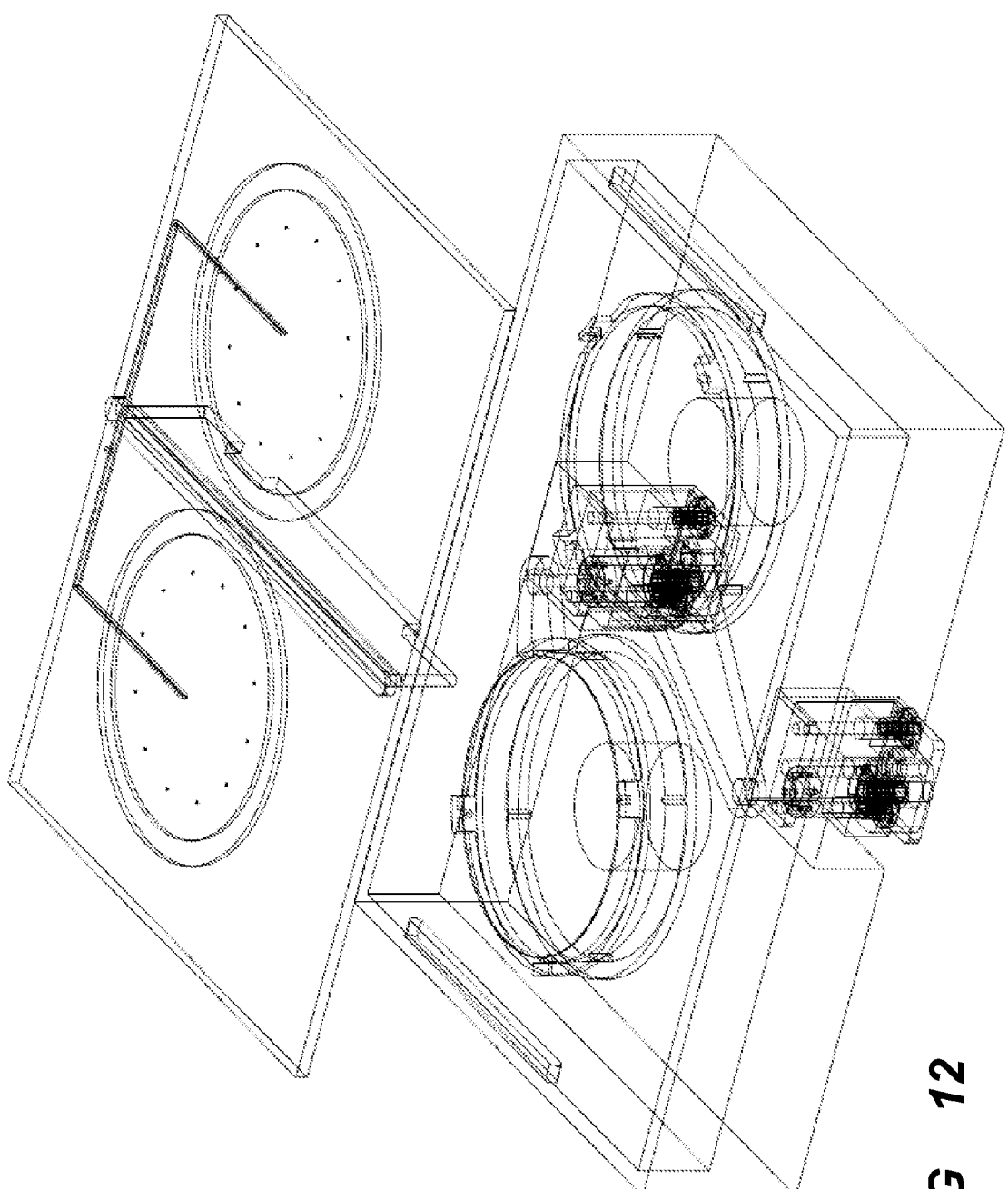
FIG. 12 illustrates a view of another disassembled thermal treatment apparatus with two thermal treatment chambers positioned horizontally with a retractable door therebetween.

For the apparatus described above, it comprise a heating chamber window and a cooling chamber window which are facing to the same direction for one access means. In another embodiment, the apparatus may comprise a heating chamber window facing to one direction for one access means and a cooling chamber window facing to another opposite direction for another access means, and the line across the centers of the two windows is not parallel to the side of the apparatus, as shown in FIG. 11. In another embodiment, the apparatus may comprise a heating chamber window facing to one direction for one access means and a cooling chamber window facing to another opposite direction for another access means, and the line across the centers of the two windows is parallel to the side of the apparatus, as shown in FIG. 12. It should be noticed that, since the other structures of the embodiments shown in FIG. 11 and FIG. 12 are the same as the embodiment introduced above, they will be not described again here. The difference between these embodiments is the positions of the windows.

According to the present invention, the double-side thermal treatment with both the conductive heat transfer mechanism and the convective heat transfer mechanism is realized to the semiconductor workpiece. In one embodiment, a preheating or precooling process is also included, and during the preheating and precooling process, both the first and second thermal treatment members apply a convective hear transfer mechanism.

The apparatus with horizontally arranged chambers is adapted to: heat and cool a thin film or a stack of thin films; or annealing metallic or insulative films in semiconductor interconnect; or reflow the solder; or cure and/or bake the polymeric coatings.

Thermal Treatment Process of Horizontally Arranged Heating and Cooling Chambers

For the thermal treatment apparatus with horizontally arranged chambers, the process is a bit different with the apparatus with vertically arranged chambers. For the apparatus with vertically arranged chambers, only one semiconductor workpiece can be treated in the apparatus for one time, but for the apparatus with horizontally arranged chambers, the heating chamber and the cooling chamber can treat more than one semiconductor workpieces simultaneously.

For example the process instructed below is based on the assumption that the time for heating is longer than that of cooling. A typical thermal treatment process is:

1) a fluid distribution means 912a in the heating chamber turns on and a retractable door moves in between the heating chamber and the cooling chamber. Heating chamber window opens and workpiece A is transferred into the heating chamber and received by a semiconductor workpiece transfer device A (either transfer device 904 or 905 could be transfer device A in the above description).

2) Semiconductor workpiece A is transferred to a preheating position by transfer device A and pre-heated, as mentioned above, according to the present invention, the semiconductor workpiece A is double-side pre-heated by both the fixed heating member and the additional heating member with a convective heating mechanism. During this step, the retractable door keeps in between the heating chamber and the cooling chamber.

3) When the pre-heating process is completed, semiconductor workpiece A is transferred onto the heating plate (for example, the heating plate 902 in FIG. 9) and double-side heated. The semiconductor workpiece A is being heated by the heating plate (fixed heating source) with a conductive heating mechanism and by the heating fluid distribution part (additional heating source) with a convective heating mechanism simultaneously. During step 3), the retractable door keeps in between the heating chamber and the cooling chamber.

4) When the heating process is completed, a fluid distribution part 912b in the cooling chamber turns on and the retractable door moves out of the chambers. The heating and cooling chambers are connected so that the semiconductor workpiece can be transferred. Then semiconductor workpiece A is transferred to the cooling chamber by transfer device A. Now the heating chamber is free, so simultaneously semiconductor workpiece B is transferred into the heating chamber by another transfer device B. During step 4), the retractable door keeps out of the chambers. In one embodiment, the semiconductor workpiece is precooled during the process it is transported from the heating chamber into the cooling chamber.

5) The retractable door moves in between the heating and cooling chambers again. Now semiconductor workpiece A is in the cooling chamber and semiconductor workpiece B is in the heating chamber, they can be treated simultaneously. The heating process that semiconductor workpiece B undergoes is the same as that mentioned above and will not be repeated. For the cooling process that semiconductor workpiece A undergoes, transfer device A put semiconductor workpiece A on the cooling plate (for example, the cooling plate 903 in FIG. 9). Semiconductor workpiece A is double-side cooled by the cooling plate (fixed cooling source) with a conductive cooling mechanism on the backside and the cooling fluid distribution system (additional cooling source) with a convective cooling mechanism on the front side simultaneously. During step 5), the retractable door keeps in between chambers.

6) If the heating time is longer than the cooling time, semiconductor workpiece A finishes the cooling process first and then is transferred out of the cooling chamber. Since the heating time is longer than the cooling time, semiconductor workpiece B is still being heated when semiconductor workpiece A is transferred out of the cooling chamber. And cooling chamber is free. During step 6), the retractable door keeps in between chambers.

7) When semiconductor workpiece B finishes heating, the retractable door moves out of chambers for transferring semiconductor workpiece B into the cooling chamber, simultaneously semiconductor workpiece C is transferred into the heating chamber and received by transfer device A. The following procedure is the same as described above.

Figure 13:
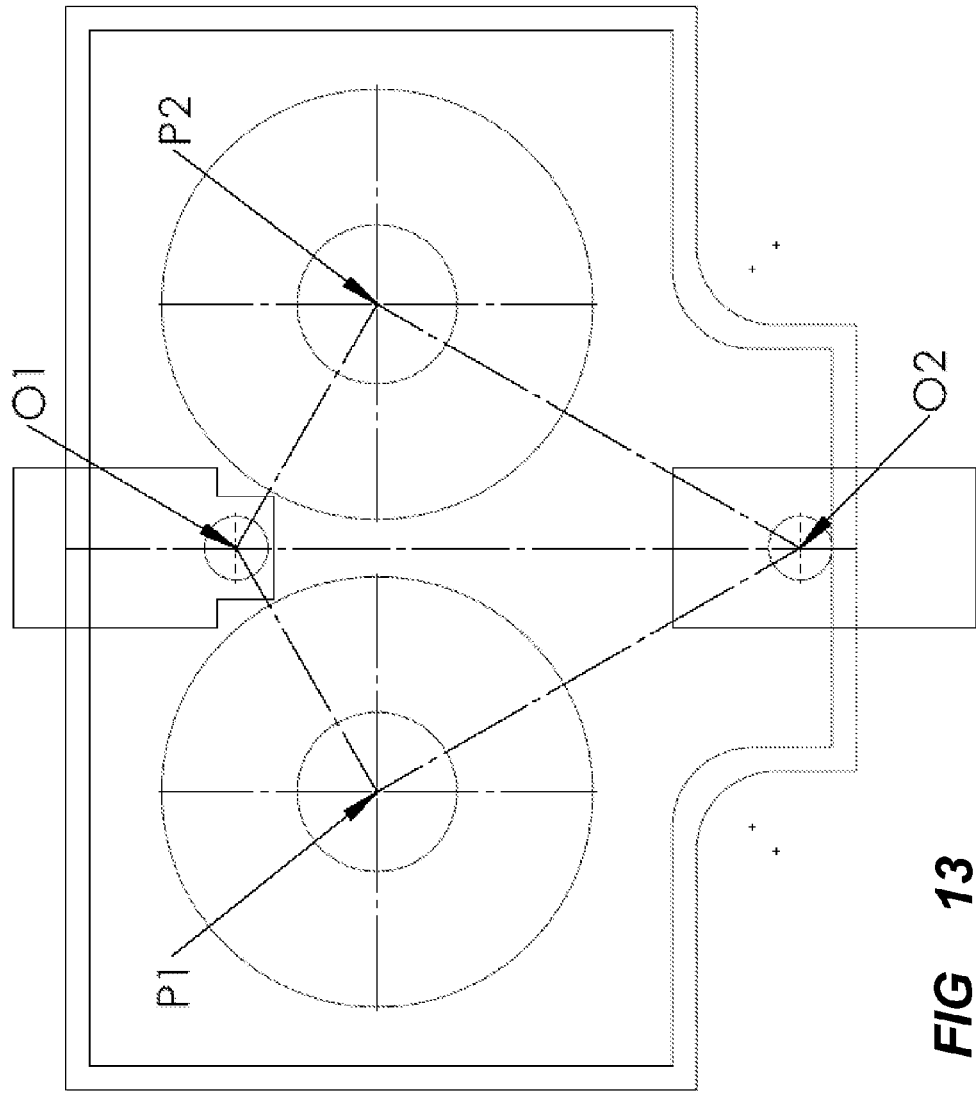
FIG. 13 illustrates the method in which the heating chamber, the cooling chamber and the transportation mechanisms are arranged.

In order to ensure that the two transfer devices do not interfere with each other during the transportation of semiconductor workpieces, the two transfer devices are positioned in a certain configuration and may be designed with different lengths. As shown in FIG. 13, P1 denotes the center of the heating plate and P2 denotes the center of the cooling plate. O1 and O2 are the axis around which the transfer devices rotate. The angle between O1P1 and O1P2 and that between O2P1 and O2P2 relates to the number of fingers on the transfer device. And for example, if the transfer devices comprise 4 fingers, FIG. 13 illustrates a way in which the heating chamber, the cooling chamber and the transportation mechanism are arranged. The angle between O1P1 and O1P2 and that between O2P1 and O2P2 are both 90 degree.

Figure 14:
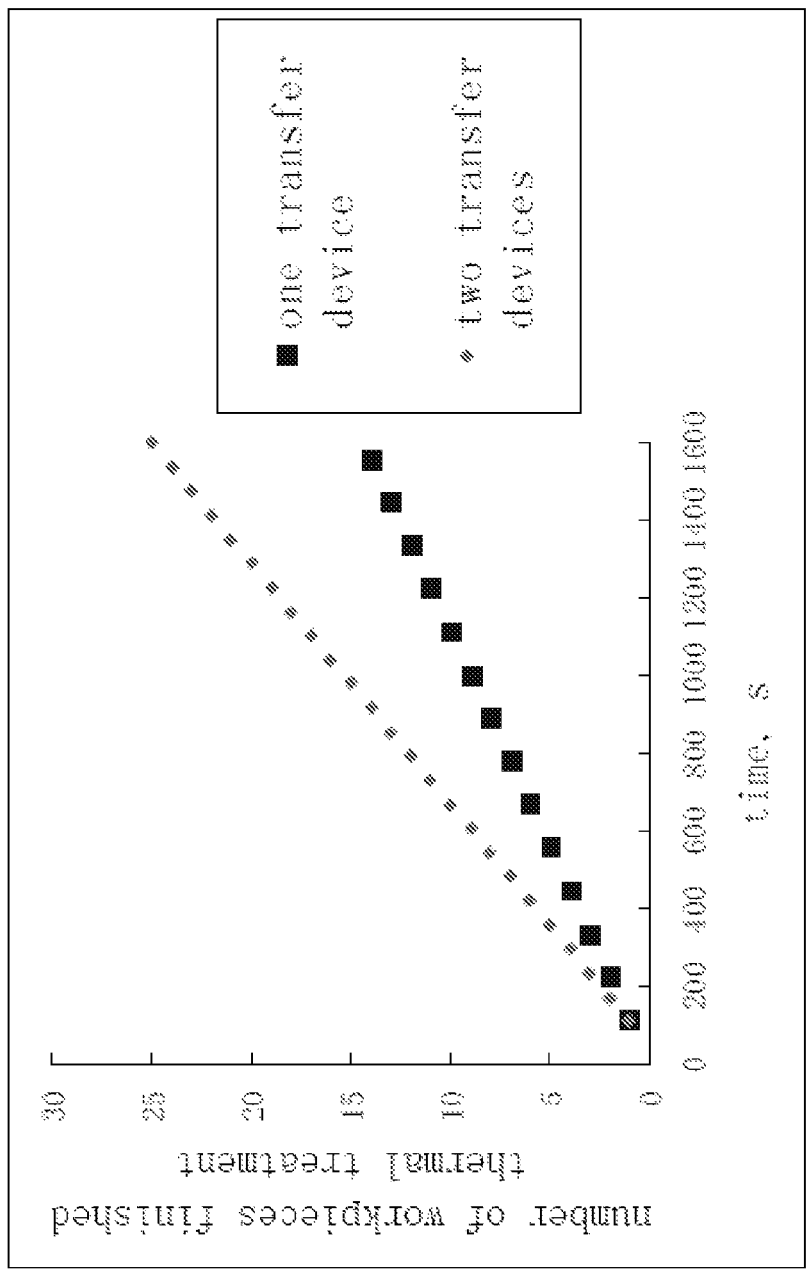
FIG. 14 illustrates the comparison of throughput of apparatus with two transfer devices and that with one transfer device.

Based on the descriptions of the third embodiment of the apparatus and the process embodiment, more than one semiconductor workpieces could be thermally treated simultaneously in the apparatus with two transfer devices. Thus the throughput is greatly improved compared to that of the apparatus with only one transfer device. For a given recipe, the time for thermal treatment as a function of the number of treated semiconductor workpieces is shown in FIG. 14 for both apparatus. The throughput improves 73.6 percent for apparatus with 2 transfer devices compared to that with one transfer device.

It should be noticed that the thermal treatment process for horizontally arranged chambers mentioned above is only an example of the thermal treatment process provided by the present invention. For one of the ordinary skilled in the art, the following range can be obtained from the present description without doubt. Therefore, the present invention shall not be limited to the embodiment, but along with the scope of the claims.

Based on the descriptions of the embodiments of the apparatus and the process embodiment, the method for thermal treatment process of semiconductor workpieces may be concluded as comprising at least: providing a heating chamber and a cooling chamber positioned horizontally adjacent; providing a retractable door for separating the heating chamber and the cooling chamber; providing first heating members at bottom of the heating chamber, and second heating members at top of heating chamber; providing first cooling members at bottom of the heating chamber, and second cooling members at top of heating chamber; moving the retractable door out between the heating chamber and the cooling chamber and transporting a first semiconductor workpiece into the heating chamber and second semiconductor workpiece into the cooling chamber; moving the retractable door in between the heating chamber and cooling chamber and starting heating and cooling processes; transporting the second semiconductor workpiece out of the cooling chamber after the cooling process completes; moving the retractable door out between the heating chamber and cooling chamber and transporting the first semiconductor workpiece from the heating chamber into the cooling chamber after the heating process completes; transporting a third semiconductor workpiece into the heating chamber; moving the retractable door in between the heating chamber and cooling chamber and starting heating and cooling processes; repeating the above steps.

The heating chamber has an additional heating member, for example, a heating fluid or fluid distribution system facing to a fixed heating member in the heating chamber, the fixed heating member provides a fixed heating source while the additional heating member provides as an additional heating source during the heating process. The cooling chamber has an additional heating member, for example, a cooling fluid or fluid distribution system facing to a fixed cooling member in the cooling chamber, the fixed cooling member provides a fixed cooling source while the additional cooling member provides an additional cooling source during the cooling process.

According to the present invention, a double-side thermal treatment with both the conductive heat transfer mechanism and the convective heat transfer mechanism is realized to the semiconductor workpiece.

In one embodiment, the semiconductor workpiece is preheated before the heating process starts, and the semiconductor workpiece is precooled before the cooling process starts.

The cooling time in cooling chamber is T1, the heating time in heating chamber is T2, and if $T1 \leq T2$, then time to transport the first semiconductor workpiece into heating chamber will be set at least T1−T2 later than time to transport the second semiconductor workpiece into cooling chamber; if $T1 < T2$, then time to transport the first semiconductor workpiece into heating chamber will be set at least T2−T1 earlier than time to transport the second semiconductor workpiece into cooling chamber.

The double-side thermal treatment method can be applied in the following application, for example: heat and cool a thin film or a stack of thin films; or annealing metallic or insulative films in semiconductor interconnect; or reflow the solder; or cure and/or bake the polymeric coatings.

The adapted double-side thermal treatment mechanism of the present invention increases the efficiency and throughput and uniformity of the thermal treatment and reduces thermal stress mismatch and semiconductor workpiece deformation.

The previous description of the disclosed embodiments is provided to enable any person skilled in the art to make or use the present invention. Various modifications to these embodiments will be readily apparent to those skilled in the art and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An apparatus for thermal treatment of semiconductor workpieces, comprising:
   vertically arranged heating and cooling chambers;
   a transportation mechanism for transporting a semiconductor workpiece between the heating chamber and the cooling chamber;
   a retractable door for separating the heating chamber and the cooling chamber;
   wherein the retractable door moves in between the heating chamber and the cooling chamber when a heating process or a cooling process starts; and
   the retractable door comprising a heating layer and a cooling layer.

2. The apparatus of claim 1, wherein said heating chamber comprising a fixed heating member being positioned at bottom side of the heating chamber; said heating layer on the retractable door being positioned at a surface facing to said fixed heating member in the heating chamber.

3. The apparatus of claim 2, wherein the fixed heating member comprising heating coils or other heating means, and the heating layer on the retractable door comprising heating coils or other heating means.

4. The apparatus of claim 2, wherein the fixed heating member performs a conductive heat transfer mechanism and the heating layer performs a convective heat transfer mechanism during a heating process.

5. The apparatus of claim 2, wherein the semiconductor workpiece is preheated before a heating process starts.

6. The apparatus of claim 5, wherein the fixed heating member and the heating layer perform a convective heat transfer mechanism when the semiconductor workpiece is preheated.

7. The apparatus of claim 1, wherein said cooling chamber comprising a fixed cooling member being positioned at top side of the cooling chamber, and said cooling layer on the retractable door being positioned at a surface facing to said fixed cooling member in the cooling chamber.

8. The apparatus of claim 7, wherein the fixed cooling member comprising a cool fluid distribution means.

9. The apparatus of claim 8, wherein the fluid used in the cool fluid distribution means is selected from a group comprising at least:
   an inert gas, a mixture of inert gases or a mixture of inert gases and reductive gases, wherein the fluid mixture comprising 90-100% of inert gases and 0-10% of reductive gases.

10. The apparatus of claim 9, wherein the inert gases is selected from a group comprising at least:
    argon, helium, nitrogen or other inert fluids, and
    the reductive gases is selected from a group comprising at least: hydrogen or other reductive gases.

11. The apparatus of claim 5, the fixed cooling member performs a convective heat transfer mechanism and the cooling layer performs a conductive heat transfer mechanism.

12. The apparatus of claim 5, wherein the semiconductor workpiece is precooled before a cooling process starts.

13. The apparatus of claim 12, wherein the fixed cooling member and the cooling layer perform a convective heat transfer mechanism when the semiconductor workpiece is precooled.

14. The apparatus of claim 7, wherein the cooling layer comprising cooling coil,
    wherein a coolant being circulated through the cooling coil to remove heat out from the semiconductor workpiece.

15. The apparatus of claim 1, wherein the retractable door further comprises a gap being placed between said heating layer and said cooling layer.

16. The apparatus of claim 1, wherein the apparatus is used for:
    heating and cooling a thin film or a stack of thin films.

17. The apparatus of claim 1, wherein the apparatus is used for:
    annealing metallic or insulative films in semiconductor interconnect.

18. The apparatus of claim 1, wherein the apparatus is used for:
    reflowing the solder.

19. The apparatus of claim 1, wherein the apparatus is used for:
    curing and/or baking the polymeric coatings.

20. The apparatus of claim 1, wherein the retractable door further comprising a linear moving mechanism to drive the retractable door in and out between the heating chamber and the cooling chamber.

21. The apparatus of claim 1, wherein the retractable door further comprising a rotational moving mechanism to drive the retractable door in and out between the heating chamber and the cooling chamber.

22. The apparatus of claim 1, wherein the transportation mechanism comprising at least three lift pins through the fixed heating member.

23. An apparatus for thermal treatment of semiconductor workpieces, comprising:
    horizontally adjacent heating and cooling chambers;
    a transportation mechanism for transporting a semiconductor workpiece between the heating chamber and the cooling chamber; and
    a retractable door for separating the heating chamber and the cooling chamber;
    wherein the retractable door moves in between the heating chamber and the cooling chamber when a heating process or cooling process starts and wherein the retractable door comprising a heating layer and a cooling layer.

24. The apparatus of claim 23, wherein said heating chamber comprising first heating member positioned on bottom of the heating chamber and second heating member positioned on top of the heating chamber.

25. The apparatus of claim 24, wherein the first heating member performs a conductive heat transfer mechanism and the second heating member performs a convective heat transfer mechanism during a heating process.

26. The apparatus of claim 24, wherein the semiconductor workpiece is preheated before a heating process starts.

27. The apparatus of claim 26, wherein the first heating member and the second heating member perform a convective heat transfer mechanism when the semiconductor workpiece is preheated.

28. The apparatus of claim 23, wherein the cooling chamber comprising first cooling member positioned on bottom of the heating chamber and second cooling member positioned on top of heating chamber.

29. The apparatus of claim 28, wherein the first cooling member performs a conductive heat transfer mechanism and the second cooling member performs a convective heat transfer mechanism during a cooling process.

30. The apparatus of claim 28, wherein the semiconductor workpiece is precooled before a cooling process starts.

31. The apparatus of claim 30, wherein the first cooling member and the second cooling member perform a convective heat transfer mechanism when the semiconductor workpiece is precooled.

32. The apparatus of claim 23, wherein said transport mechanism comprises at least one transfer device.

33. The apparatus of claim 23, wherein said transport mechanism comprising two transfer devices.

34. The apparatus of claim 33, wherein the two transfer devices have arms, and the lengths of the arms of the two transfer devices are different.

35. The apparatus of claim 23, wherein said transfer devices comprising 3 supporting fingers, and the angle between the line across the rotating axis of one transfer device and the center of the heating plate and the line across the rotating axis of the other transfer device and the center of the heating plate is 120°.

36. The apparatus of claim 23, wherein said transfer devices comprising 4 supporting fingers, and the angle between the line across the rotating axis of one transfer device and the center of the heating plate and the line across the rotating axis of the other transfer device and the center of the heating plate is 90°.

37. The apparatus of claim 23, wherein said transfer devices comprising 5 supporting fingers, and the angle between the line across the rotating axis of one transfer device and the center of the heating plate and the line across the rotating axis of the other transfer device and the center of the heating plate is 144°.

38. The apparatus of claim 23, wherein said transfer devices comprising 6 supporting fingers, and the angle between the line across the rotating axis of one transfer device and the center of the heating plate and the line across the rotating axis of the other transfer device and the center of the heating plate is 120°.

39. The apparatus of claim 23, wherein the heating chamber further comprising a window for loading the semiconductor workpiece in, and cooling chamber further comprising a window for loading the semiconductor workpiece out.

40. The apparatus of claim 23, wherein the apparatus is used for:
heating and cooling a thin film or a stack of thin films.

41. The apparatus of claim 23, wherein the apparatus is used for annealing metallic or insulative films in semiconductor interconnect.

42. The apparatus of claim 23, wherein the apparatus is used for:
reflowing the solder.

43. The apparatus of claim 23, wherein the apparatus is used for:
curing and/or baking the polymeric coatings.

44. A method for thermal treatment of semiconductor workpieces, comprising:
providing a heating chamber and a cooling chamber being stacked vertically;
providing a retractable door for separating the heating chamber and the cooling chamber;
providing a fixed heating member at bottom of the heating chamber, and a heating layer at the lower surface of the retractable door;
providing a fixed cooling member at top of the cooling chamber, and a cooling layer at the upper surface of the retractable door;
moving the retractable door in between the heating chamber and cooling chamber and transporting a semiconductor workpiece into the heating chamber;
starting heating processes;
moving the retractable door out between the heating chamber and cooling chamber and transporting the semiconductor workpiece from the heating chamber into the cooling chamber when the heating process completes;
moving the retractable door in between the heating chamber and cooling chamber and starting cooling processes;
transporting the semiconductor workpiece out of the cooling chamber.

45. The method of claim 44, further comprising:
preheating the semiconductor workpiece before the heating process starts.

46. The method of claim 44, further comprising:
precooling the semiconductor workpiece before the cooling process starts.

47. A method for thermal treatment of semiconductor workpieces, comprising:
providing a heating chamber and a cooling chamber positioned horizontally adjacent;
providing a retractable door for separating the heating chamber and the cooling chamber;
providing first heating member at bottom of the heating chamber, and second heating member at top of heating chamber,
providing first cooling member at bottom of the cooling chamber, and second cooling member at top of cooling chamber,
moving the retractable door out between the heating chamber and the cooling chamber and transporting a first semiconductor workpiece into the heating chamber and second semiconductor workpiece into the cooling chamber;
moving the retractable door in between the heating chamber and cooling chamber and starting heating and cooling processes;
transporting the second semiconductor workpiece out of the cooling chamber after the cooling process completes;
moving the retractable door out between the heating chamber and cooling chamber and transporting the first semiconductor workpiece from the heating chamber into the cooling chamber after the heating process completes;
transporting a third semiconductor workpiece into the heating chamber;
moving the retractable door in between the heating chamber and cooling chamber and starting heating and cooling processes;
repeating the above steps.

48. The method of claim 47, further comprising:
preheating the semiconductor workpiece before the heating process starts.

49. The method of claim 47, further comprising:
precooling the semiconductor workpiece before the cooling process starts.

50. The method of claim 47, wherein the cooling time in cooling chamber is T1, the heating time in heating chamber is T2, and
if $T1 \leq T2$, then time to transport the first semiconductor workpiece into heating chamber will be set at least T1−T2 later than time to transport the second semiconductor workpiece into cooling chamber; and
if $T1 < T2$, then time to transport the first semiconductor workpiece into heating chamber will be set at least T2−T1 earlier than time to transport the second semiconductor workpiece into cooling chamber.

* * * * *